United States Patent [19]
Tabara

[11] Patent Number: 5,998,300
[45] Date of Patent: *Dec. 7, 1999

[54] METHOD OF MANUFACTURING A SEMICONDUCTOR DEVICE USING ANTIREFLECTION COATING

[75] Inventor: Suguru Tabara, Hamamatsu, Japan

[73] Assignee: Yamaha Corporation, Hamamatsu, Japan

[*] Notice: This patent is subject to a terminal disclaimer.

[21] Appl. No.: 08/891,188

[22] Filed: Jul. 10, 1997

Related U.S. Application Data

[62] Division of application No. 08/455,480, May 31, 1995, Pat. No. 5,707,883, which is a division of application No. 08/141,140, Oct. 22, 1993, abandoned.

[30] Foreign Application Priority Data

Oct. 23, 1992 [JP] Japan .................................. 4-309590

[51] Int. Cl.⁶ .............................................. H01L 21/311
[52] U.S. Cl. ..................... 438/700; 438/738; 438/740; 438/620; 438/636
[58] Field of Search .................................. 438/700, 735, 438/738, 740, 618, 620, 622, 634, 636

[56] References Cited

U.S. PATENT DOCUMENTS

| | | |
|---|---|---|
| 4,820,611 | 4/1989 | Arnold, III et al. . |
| 4,857,142 | 8/1989 | Syverson . |

(List continued on next page.)

FOREIGN PATENT DOCUMENTS

| | | |
|---|---|---|
| 58-77228 | 5/1983 | Japan . |
| 1-241125 | 9/1989 | Japan . |
| 1241125 | 9/1989 | Japan . |
| 2-144916 | 6/1990 | Japan . |
| 432227 | 2/1992 | Japan . |
| 4-144230 | 5/1992 | Japan . |
| 555130 | 3/1993 | Japan . |

OTHER PUBLICATIONS

Monthly Semiconductor World, 1990, Technical Report, pp. 81–84.

Riley, E. Paul, "Plasma Etching of Aluminum for ULSI Circuits", Solid State Technology, Feb. 1993, pp. 47–55.

Maa, J.S., "Anisotropic Etching of Polysilicon in a Single–Wafer Aluminum Reactor", J. Vac. Sci. Technol. B9(3), May/Jun. 1991, pp. 1596–1597.

Wolf, S., et al., "Silicon Processing for the VLSI Era", vol. 1, 1986, Lattice Press, pp. 555–559.

*Primary Examiner*—Tuan H. Nguyen
*Attorney, Agent, or Firm*—Pillsbury Madison & Sutro LLP

[57] ABSTRACT

A method for manufacturing a semiconductor device having a conductive film formed overlying an insulating film overlying the surface of a semiconductor substrate, the conductive film being made, for example, of a material such as polysilicon, $WSi_2$, Al and Al alloy, and the like. An antireflection film, made of silicon nitride, for example, is formed overlying the surface of the conductive film, the antireflection film reducing light scattering from the conductive film and having a lower etching rate than the etching rate of the conductive film. The antireflection film is patterned to provide a mask for etching the conductive film, and the conductive film is etched using the patterned antireflection film as a mask to form a gate electrode for an MOS transistor, for example. Source and drain regions, for the MOS transistor, for example, are formed in the semiconductor substrate, and an interlayer insulating film is formed overlying the insulating film overlying the semiconductor substrate, the gate electrode and the antireflection film mask remaining on the surface of the gate electrode. The interlayer insulating film is selectively etched to form a deep contact hole, piercing to the semiconductor substrate in the source region, for example, and a shallow contact hole, piercing to the gate electrode. The antireflection film mask remaining on the surface of the gate electrode retards the etching of the shallow contact hole so that the etchings of the shallow contact hole and of the deep contact hole are completed substantially simultaneously.

13 Claims, 25 Drawing Sheets

U.S. PATENT DOCUMENTS

| | | |
|---|---|---|
| 4,885,259 | 12/1989 | Osinski et al. . |
| 4,966,870 | 10/1990 | Barber et al. .......................... 438/637 |
| 5,066,615 | 11/1991 | Brady et al. . |
| 5,160,407 | 11/1992 | Latchford et al. . |
| 5,219,783 | 6/1993 | Moslehi . |
| 5,231,053 | 7/1993 | Bost et al. .............................. 438/627 |
| 5,286,344 | 2/1994 | Blalock et al. . |
| 5,298,463 | 3/1994 | Sandhu et al. . |
| 5,313,100 | 5/1994 | Ishii et al. .............................. 257/751 |
| 5,326,431 | 7/1994 | Kadomura . |
| 5,338,398 | 8/1994 | Szwejkowski et al. . |
| 5,369,053 | 11/1994 | Fang ........................................ 438/637 |
| 5,399,527 | 3/1995 | Tabara . |
| 5,403,781 | 4/1995 | Matsumoto et al. . |
| 5,429,070 | 7/1995 | Campbell et al. . |
| 5,451,543 | 9/1995 | Woo et al. . |
| 5,561,084 | 10/1996 | Takata . |
| 5,658,425 | 8/1997 | Halman et al. ......................... 438/620 |
| 5,712,194 | 1/1998 | Kanazawa ............................... 438/618 |

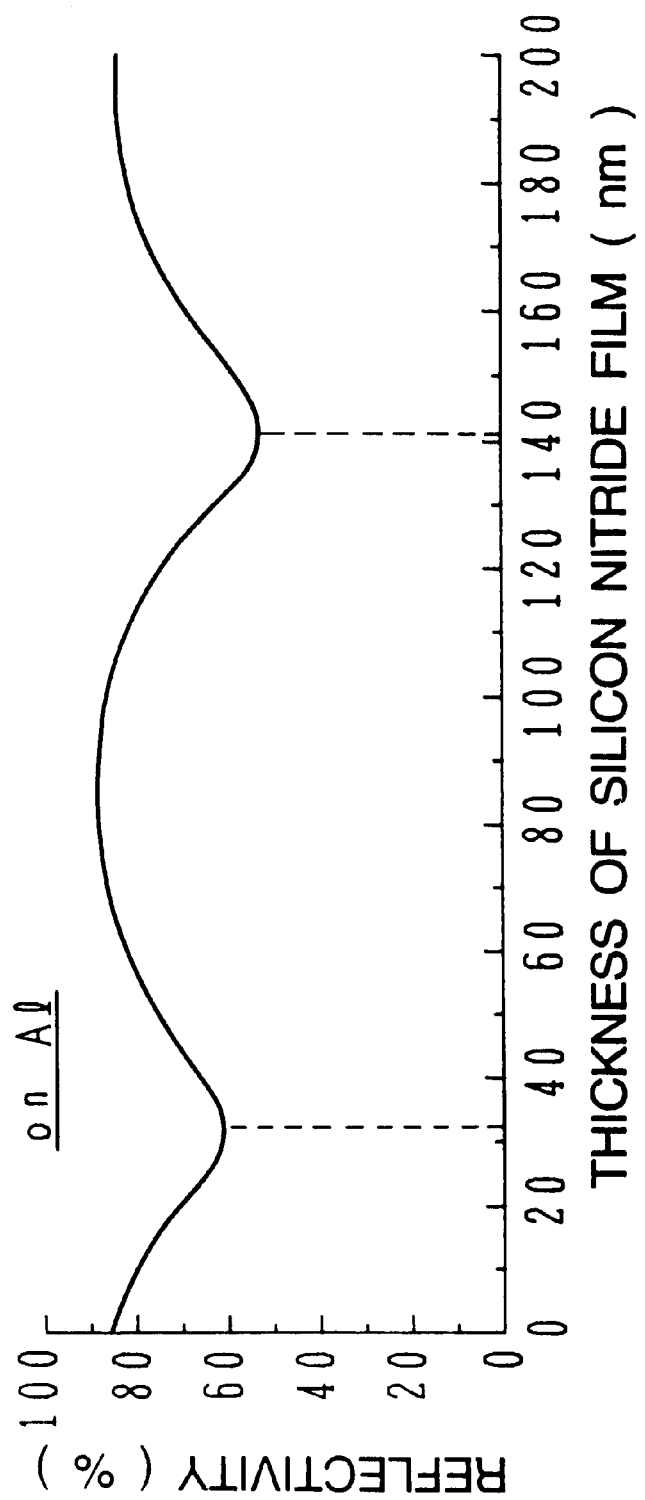

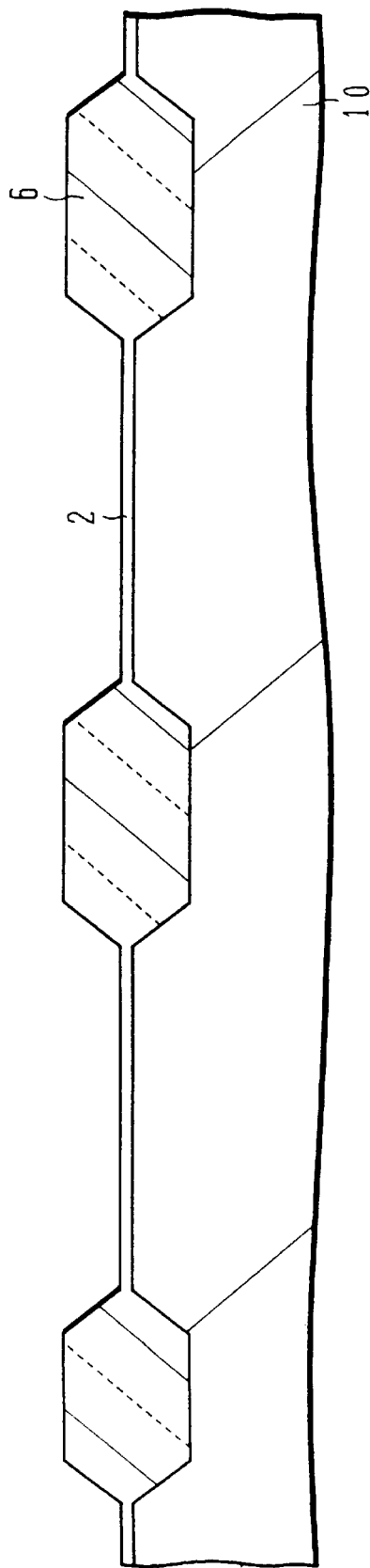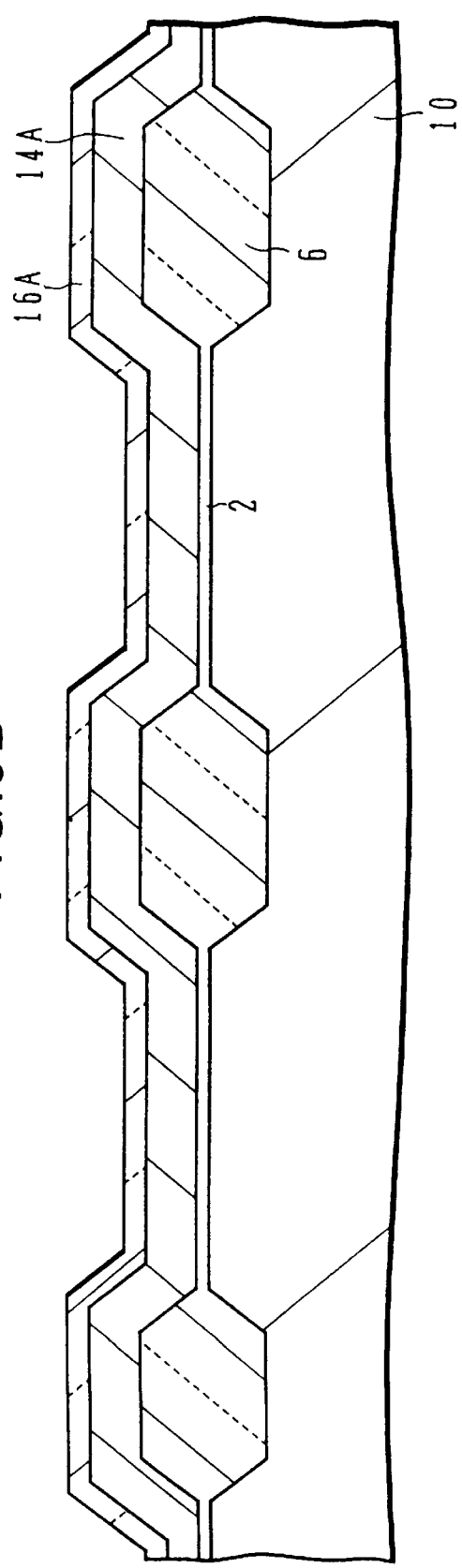

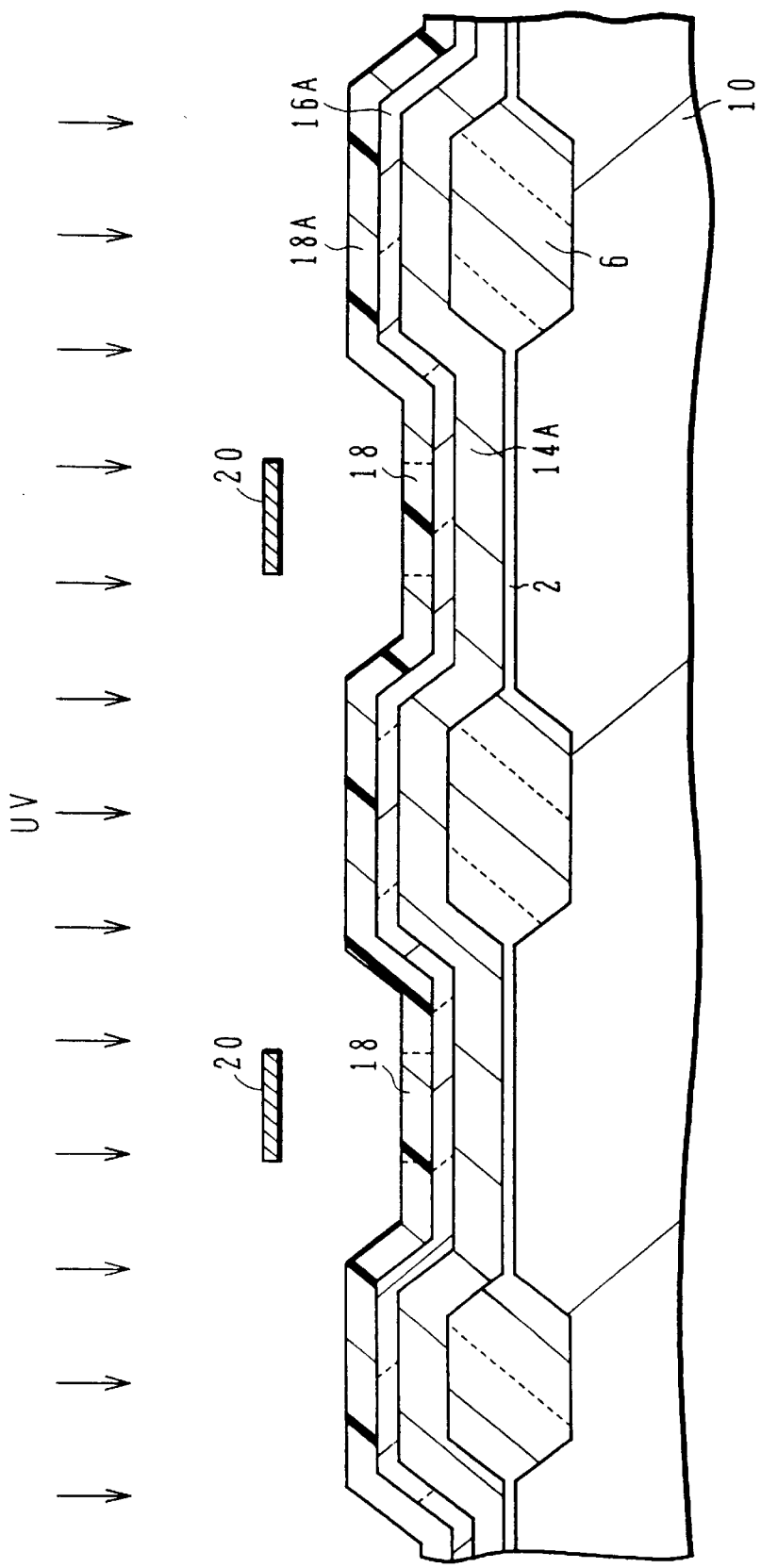

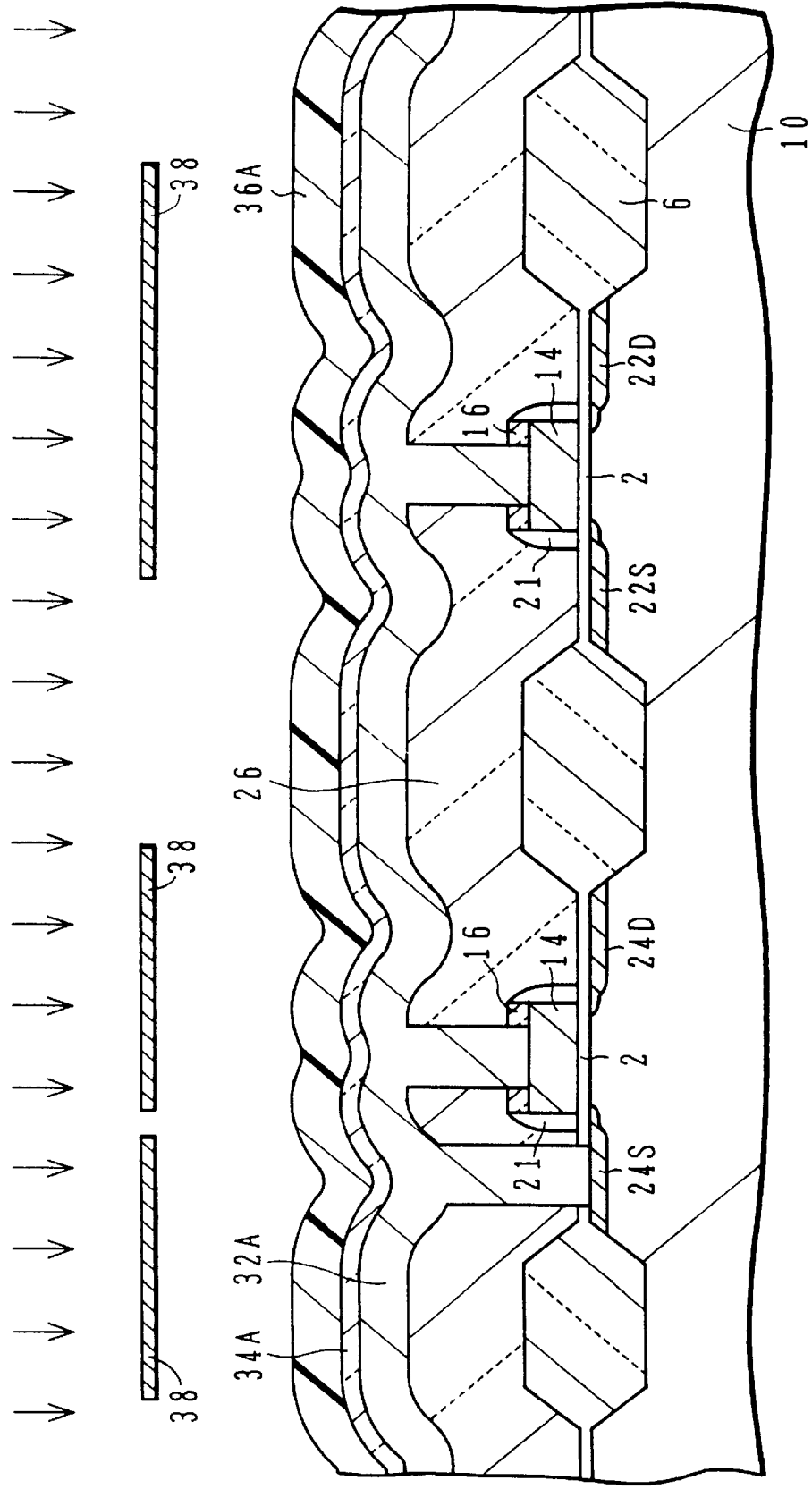

METHOD OF MANUFACTURING A SEMICONDUCTOR DEVICE USING ANTIREFLECTION COATING

This is a divisional of application Ser. No. 08/455,480, filed May 31, 1995, now U.S. Pat. No. 5,707,883, which is a divisional of application Ser. No. 08/141,140, filed Oct. 22, 1993, now abandoned.

BACKGROUND OF THE INVENTION a) Field of the Invention

The present invention relates to a semiconductor device having an antireflection film on the surface of a wiring layer, and a method of manufacturing such a semiconductor device. More particularly, the invention relates to a semiconductor device and a method of manufacturing the same, capable of forming a fine wiring at a high precision.

b) Description of the Related Art

A resist exposure process such as illustrated in FIG. 11 has been used for manufacturing a semiconductor device such as an LSI.

Referring to FIG. 11, on the surface of a semiconductor substrate 1 such as silicon (Si) substrate, an insulating film such as silicon oxide is selectively formed by thermal oxidation. Thereafter, a wiring layer 3A made of aluminum (Al), alloy or the like is formed by sputtering or other methods. A photoresist layer 4A is coated on the surface of the substrate by spin coating or other methods. In the following description, it is assumed that a positive resist is used.

For the resist exposure, a light shielding mask 5 corresponding to a desired wiring pattern is disposed above the substrate, and light 6 is radiated down to the resist layer 4A. Since the surface of the wiring layer 3A made of Al alloy or the like has a light reflection property, the light 6 is reflected also at the slopes AB and CD at a step region. The light 6 goes back to the area of the resist layer 4A andl exposes it, in spite of the fact that the area is covered by a mask 5 and should not be exposed.

After the following resist development process, the remaining resist layer takes different sizes and dimensions in the slope area and the flat plane area such as shown in FIGS. 12 to 14. Namely, as shown in the plan view of FIG. 12, the width W at the step area becomes narrower than the width at the flat area. In other words, the wiring layer has a neck or a notch shape. The cross sections taken along lines X—X' and Y—Y become as shown in FIGS. 13 and 14, respectively. As shown in FIG. 13, the cross section at the flat area is rectangular as designed. However, as shown in FIG. 14, the cross section at the step area is semicircular and has a width W narrower than the designed width.

The narrow part having a smaller width W of the resist layer 4 broadens the variation of dimension of a wiring layer pattern formed by dry-etching the wiring layer 3A by using the resist layer 4 as the etching mask. Moreover, during the etching process, the narrow part may cause a breakage of wiring if the etching rate relative to the resist layer is low. The variation of dimension, particularly of gate electrodes, may easily become a cause of a variation of device performances.

As a method of reducing the generation of the narrow part of a resist pattern to be caused by reflected light from a slope, methods such as using resist added with dye which absorbs reflected light from a slope, and coating an antireflection film such as titanium nitride (TiN) on the surface of a wiring layer to suppress reflection at a slope, are known.

In the case of the dry etching using the resist layer 4 as the etching mask, there is another problem of a low etching rate relative to an $SiO_2$ film which underlies of the wiring layer. For example, in forming gate electrodes and wirings of a MOS LSI, the gate electrode/wiring layer such as polysilicon is dry-etched using the resist layer as the etching mask, under the condition that the etching rate or speed of the gate electrode/wiring layer is faster than that of the mask. If the etching rate relative to the $SiO_2$ is low, the $SiO_2$ film serving as the gate insulating film is over-etched and made thin. As a result, the device performance iaiay change because the $SiO_2$ film is very thin. It is therefore required to raise the etching rate relative to an underlying layer such as an $SiO_2$ film.

In order to meet this requirement, use of a silicon oxide film in place of a resist film as the etching mask, is known (for example, refer to a monthly magazine "Semiconductor World", January, 1990, pp.81 to 84). In this case, in order to stop or reduce a supply of carbon (C) to the etching system, a silicon oxide film not containing C is used as the etching mask instead of a resist film containing C. By using a chlorine-based (Cl-based) or bromine-based (Br-based) based gas as an etchant, the etching rate of a wiring layer relative to an $SiO_2$ film can be improved.

If a resist film added with dye is used, the resolution of the resist film patterning lowers so that a fine wiring is difficult to form. Moreover, as shown in FIG. 15, the resist layer 4 is likely to have a tapered section with skirt regions 4a and 4b. The skirt regions 4a and 4b are etched at the later process, making the width of the wiring layer narrower than a desired width.

If a TiN antireflection film, the resist layer 4 as an etching mask, and gas containing Cl or Br, are used to plasma-etch the lamination of the wiring layer and TiN film, a wiring made of the remaining wiring layer 3 and TiN film 5 can be obtained as shown in FIG. 16. However, because of a low etching speed, the etching selectivity relative to the resist film lowers, and a fine wiring is not able to be formed.

Furthermore, the reaction product by the etching gas and TiN attaches to the pattern side walls to form sticking layers 6a and 6b: As a result, the width $W_1$ of the resist layer increases to $W_2$, making the width of a wiring broader than a desired width. The increase of the width depends on the density of a pattern. The coarser the pattern, the increment width becomes greater and the variation of dimension becomes larger.

If a silicon oxide is used as an etching mask, the narrower area of a resist pattern caused by reflected light from a slope is inevitable because the silicon oxide film will not function as an antireflection film.

SUMMARY OF THE INVENTION

It is an object of the present invention to provide a semiconductor device having a fine wiring of high precision and a method of manufacturing such a semiconductor device.

According to one aspect of the present invention, there is provided a semiconductor device including a conductive material layer having a light reflection propertyw at least on the surface of the layer, and an antireflection film coated on the surface of the conductive material layer, the antireflection film being essentially made of a silicon nitride film.

According to another aspect of the present invention, there is provided a method of manufacturing a semiconductor device including the steps of forming a conductive material layer having a light reflection property at least on a surface of the layer, on an insulating surface of a substrate, coating a silicon nitride film essentially consisting of silicon nitride on the surface of the conductive layer, depositing a resist layer on the silicon nitride film, selectively exposing the resist layer, and developing the resist layer.

Since the silicon nitride film functions as an antireflection film, the narrow area of a resist pattern to be caused by reflected light from a slope can be suppressed from being generated, forming a fine wiring at a high precision.

If a conductive layer is selectively etched by using a silicon nitride film as the etching mask, the etching rate of the conductive layer relative to the etching mask can be improved, making it possible to thin the resist film and improve the resolution at a photolithography process.

When the conductive layer is selectively etched by using the silicon nitride film with the overlying resist film removed, the etching rate of the wiring layer relative to the underlying layers such as $SiO_2$ film can be improved, preventing the gate insulating film and the like from being thinned in thickness.

BRIEF DESCRIPTION OF THE DRAWINGS

FIG. 8 is a graph showing the dependency of reflectivity upon the thickness of a silicon nitride film wherein the resist layer is exposed at the process of FIG. 2 by using the conductive layer of Al.

DETAILED DESCRIPTION OF THE PREFERRED EMBODIMENTS

Figure 1:
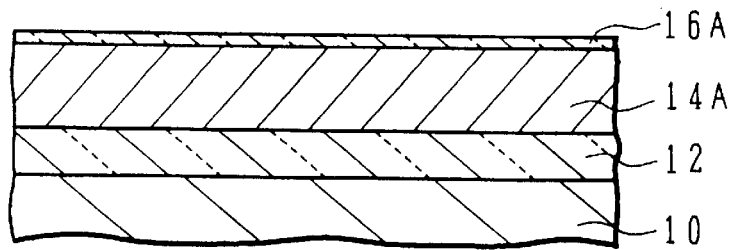
FIG. 1 is a cross-section of a substrate for explaining a silicon nitride film-forming process of a wiring-forming method according to an embodiment of the present invention.

FIGS. 1 to 5 illustrate a method of forming a wiring according to an embodiment of the present invention. Steps 1 to 5 corresponding to FIGS. 1 to 5, respectively will be described in this order.

(Step 1) An insulating film 12 of silicon oxide is formed on the surface of a semiconductor substrate 10 made of for example, Si by a local oxidation of silicon (LOCOS) (thermal oxidation with nitride mask) or the like. A conductive layer 14A such as polycrystalline silicon is formed on the insulating film 12 by chemical vapor deposition (CVFD) or the like. If polycrystalline silicon or polysilicon is used as the material of the conductive layer 14A, n-type impurities such as phosphor us are doped in the polysilicon layer 14A to lower its resistivity sufficient for use as a wiring or electrode. A silicon nitride film 16A is formed on the conductive layer 14A by CVD or sputtering. The thickness; of the silicon nitride film 16A is determined so as to provide a good antireflection effect. In the following description, an antireflection film is defined as a film significantly reducing light scattering from a surface of highly reflective metal, including aluminum, tungsten, polycrystalline silicon, and the like, during a photolithographic process. The suitable thickness of the silicon nitride film 16A depends on the material of the conductive layer 14A. Suitable thicknesses for specific materials will be later described with reference to FIGS. 6 to 8.

(Step 2) A photoresist layer 18A is formed on the substrate by spin coating or the like. Thereafter, a photolithography process (exposure and development) is performed to obtain a desired wiring pattern. With this process, the resist layer 18 corresponding to the desired pattern is left unremoved. During the exposure process, the silicon nitride film 16A functions as an antireflection film so that the resist layer 18 can be patterned precisely even in the neighborhood of a step.

(Step 3) Using the resist layer 18 as the mask, the silicon nitride film 16A is selectively etched by anisotropic dry etching to leave unetched only the silicon nitride film 16 corresponding to the resist layer 18. For example, carbon tetrafluoride ($CF_4$) or $CF_4+O_2$ is used as the etching gas for this anisotropic etching.

(Step 4) In order to improve the etching rate relative to the underlying layer ($SiO_2$ film), the remaining resist layer 18 is removed. Removing the resist layer 18 can be achieved, for example, by an ashing process using oxygen plasma followed by an acid cleaning process.

(Step 5) By using the patterned silicon nitride film 16 as the mask, the conductive layer 14A is selectively etched by anisotropic dry etching using a gas containing $Cl_2$ or HBr, and not containing F, to form a wiring or electrode made of the remaining conductive layer 14.

Figure 2:
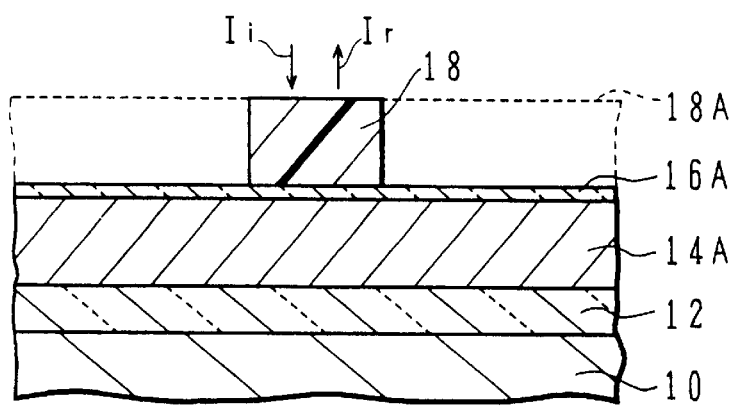
FIG. 2 is a cross-section of the substrate for explaining a resist pattern forming process following the process illustrated in FIG. 1.
Figure 3:
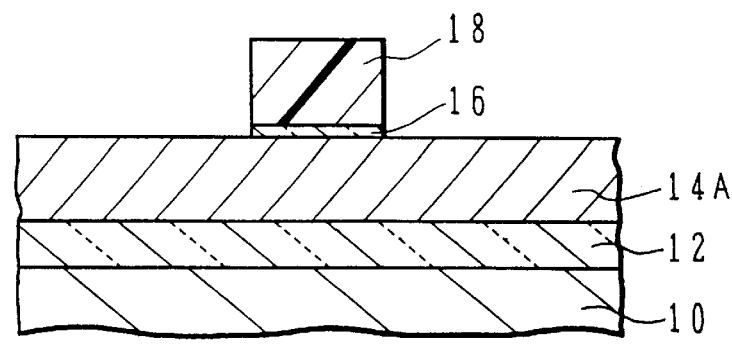
FIG. 3 is a cross-section of the substrate for explaining a silicon nitride film etching process following the process of FIG. 2.
Figure 6:
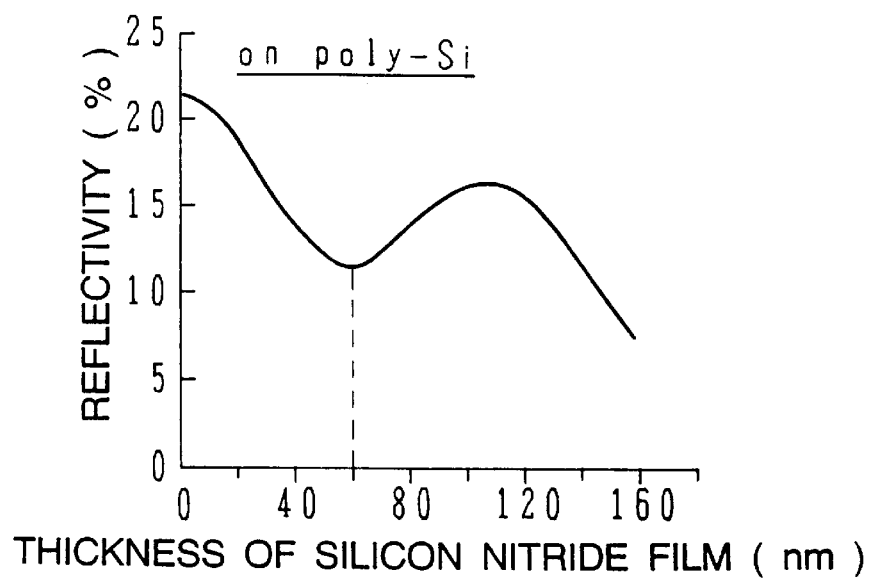
FIG. 6 is a graph showing the dependency of reflectivity upon the thickness of a silicon nitride film wherein the resist layer is exposed at the process of FIG. 2 by using the conductive layer of polysilicon.
Figure 7:
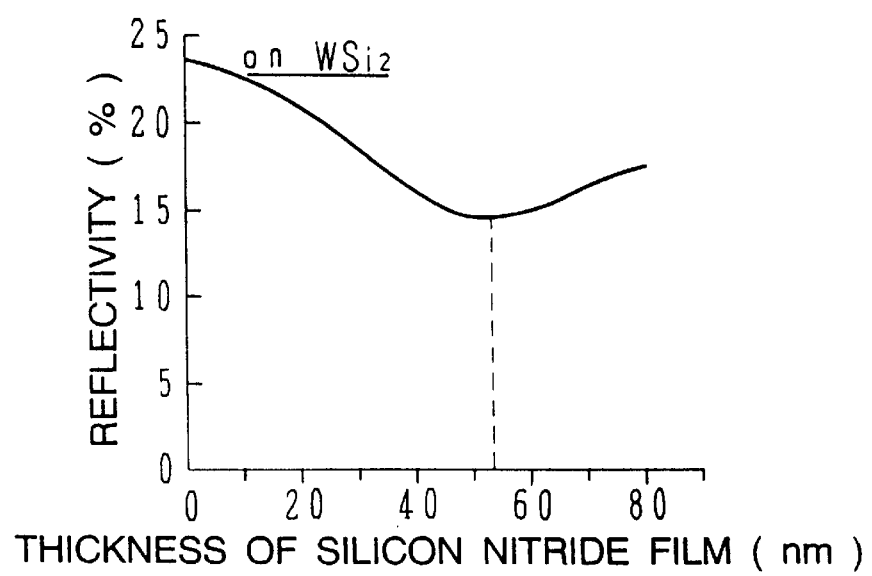
FIG. 7 is a graph showing the dependency of reflectivity upon the thickness of a silicon nitride film wherein the resist layer is exposed at the process of FIG. 2 by using the conductive layer of $WSi_2$.

FIGS. 6 to 8 are graphs explaining the antireflection effect by the silicon nitride film 16A at the exposure step shown in FIG. 2. The reflectivity shown in FIGS. 6 to 8 is expressed by the following equation:

(reflected light intensity (Ir))/(incident light intensity (Ii)) * 100%

The g line of Hg having a wavelength of 436 nm was used as the exposure light in the experiments shown in FIGS. 6; to 8. The silicon nitride film 16A was deposited by a plasma CVD.

FIG. 6 shows the dependency of reflectivity upon a silicon nitride film 16A thickness wherein the resist layer 18A was exposed as in Step 2 using polysilicon as the material of the conductive layer 14A. As seen from FIG. 6. for the polysilicon layer, a local minimum of reflectivity was present at the silicon nitride thickness of 50 to 60 nm.

FIG. 7 shows the dependency of reflectivity upon a silicon nitride film thickness wherein the resist layer 18A was exposed as in Step 2 using tungsten silicide (WSi$_2$) as 1the material of the conductive layer 14A. As seen from FIG. 7, for the WSi$_2$ layer, a local minimum of reflectivity was present at the silicon nitride thickness of 50 to 60 nm.

FIG. 8 shows the dependency of reflectivity upon a silicon nitride film thickness wherein the resist layer 18A was exposed as in Step 2 using aluminum Al as the material of the conductive layer 14A. As seen from FIG. 8, for the Al layer, local minimums of reflectivity were present at the silicon nitride thickness of about 30 nm or a little more, preferably from 25 to 40 nm, and at the silicon nitride thickness of about 140 nm or a little more, preferably from 130 to 150 nm. The same result was obtained for an aluminum alloy containing aluminum as its main component.

A good antireflection effect can thus be obtained by forming a silicon nitride film to a thickness that as makes the reflectivity small, on the surface of the conductive layer made of material such as polysilicon, WSi$_2$, Al, and Al alloy.

In the case where the wiring layer made of material such as WSi$_2$, TiN, and Al alloy, is dry-etched by using the resist layer as the etching mask and by using a Cl based gas, the etching rate relative to the resist is lower than dry-etching a silicon ox ide film by fluorocarbons. If the wiring layer is made thick to reduce resistivity, it is necessary to make the resist layer of the etching mask sufficiently thick, resulting in a low resolution.

It is also confirmed that substantially no reaction products are deposited on the side surface of the etched pattern.

Figure 10:
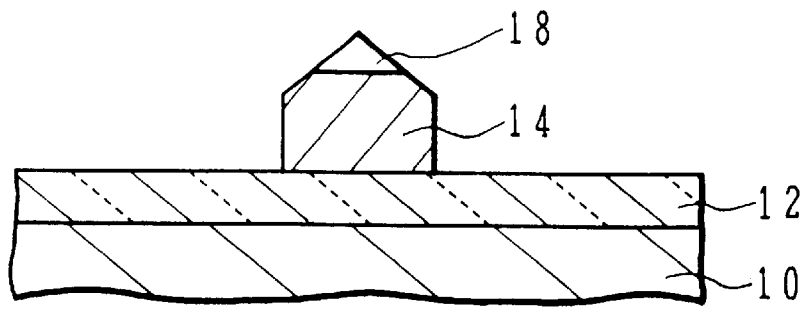
FIG. 10 is a cross section of a substrate illustrating the etching by using only a resist layer as the etching mask.
Figure 11:
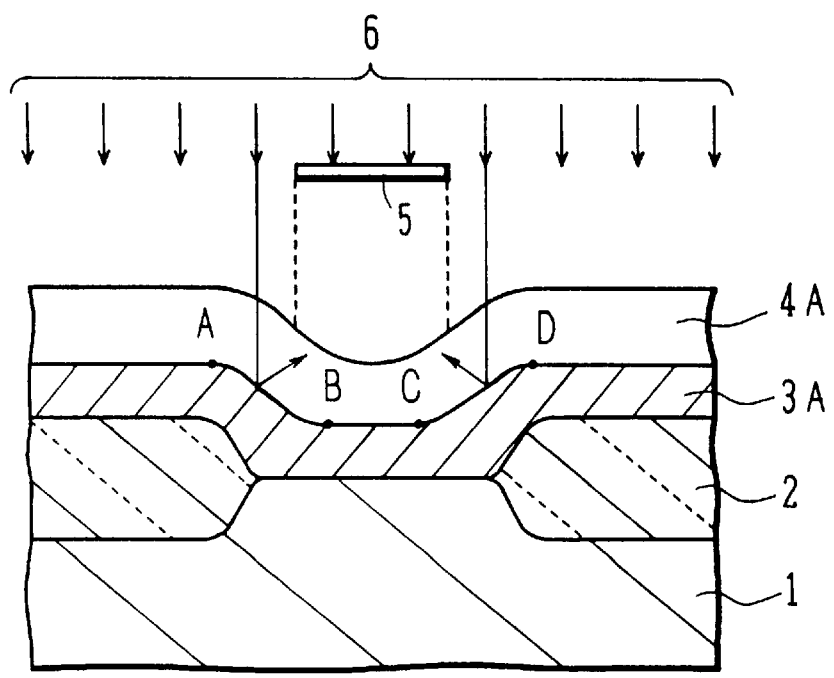
FIG. 11 is a cross section of a substrate for explaining a conventional resist exposure process.
Figure 12:
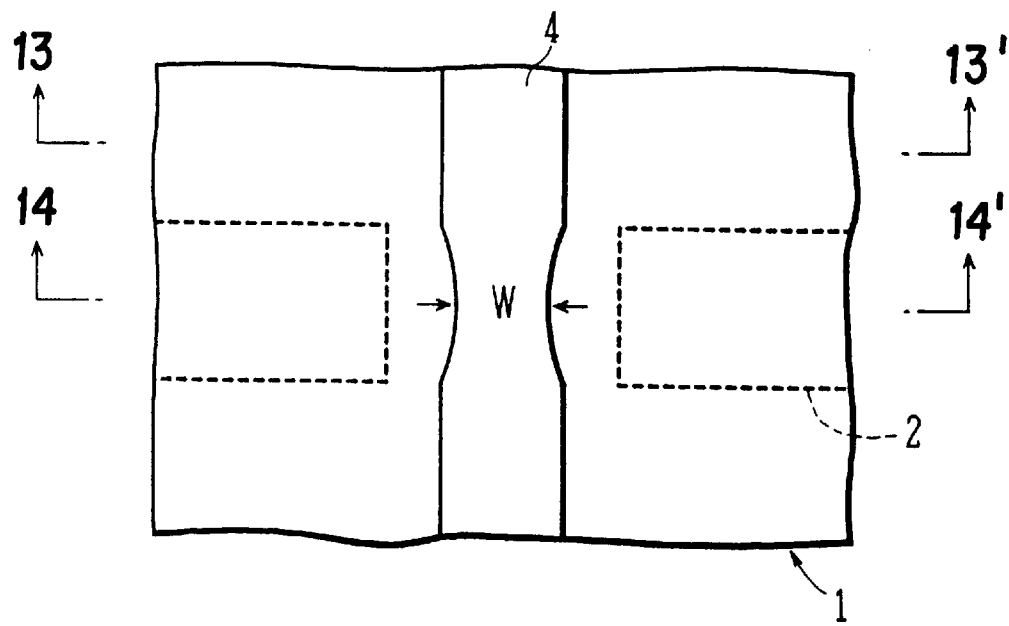
FIG. 12 is a plan view showing the substrate subjected to the resist development process after the process illustrated in FIG. 11.
Figure 13:
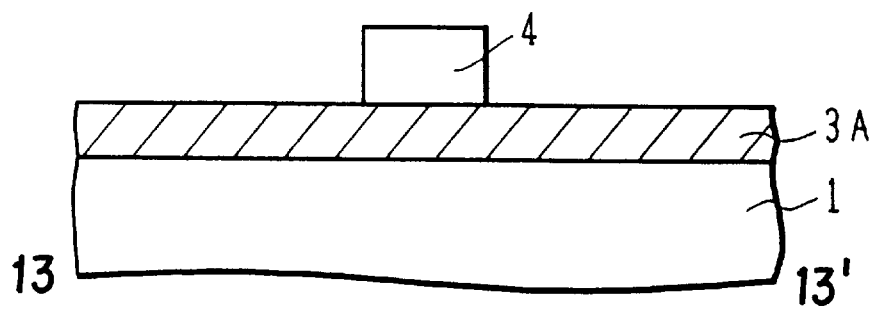
FIG. 13 is a cross section taken along line X—X' of FIG. 12.
Figure 14:
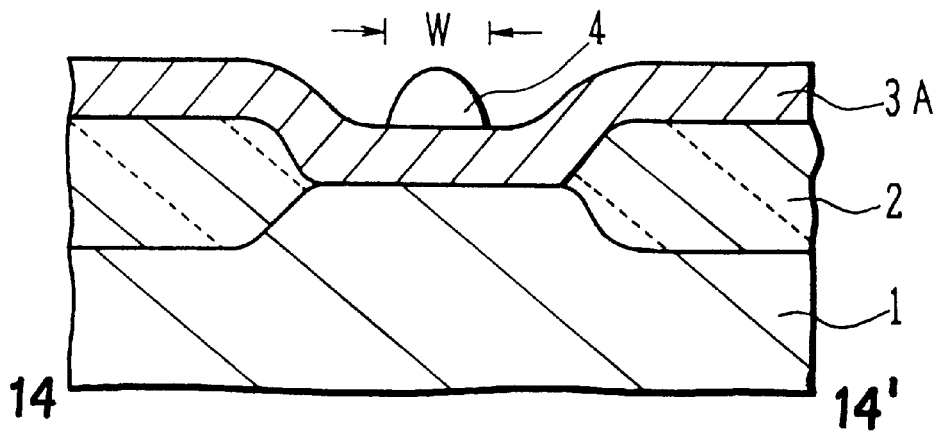
FIG. 14 is a cross section taken along line Y—Y' of FIG. 12.
Figure 15:
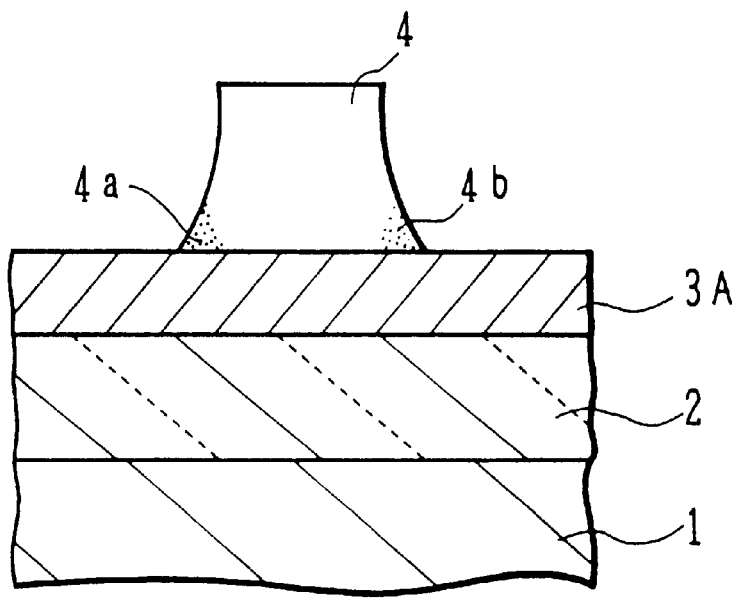
FIG. 15 is a cross section of a substrate for explaining a conventional technique using a resist film containing dye.
Figure 16:
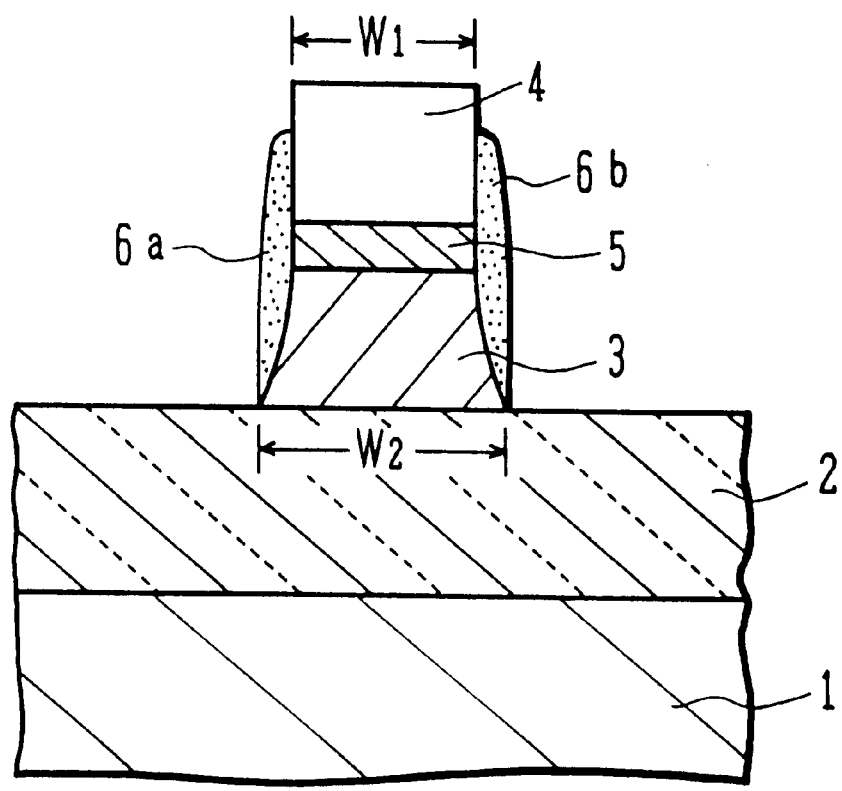
FIG. 16 is a cross section of a substrate for explaining a conventional technique using a TiN antireflection film.

If the resist layer 18 only is used as the dry-etching mask for a metal layer having a low etching rate relative to the resist, the remaining wiring layer 14 is etched also at the corner near the periphery of the mask, as shown in FIG. 10.

On the other hand , in t he case where the silicon nitride film 16 is used as the etching mask, a fine wiring cran be formed at high precision without any thinning or breakage of the wiring or generation of a neck or a notch. In addition, the resist film may be thinned so that the resolution at the photolithography process can be improved.

The etching rate relative to resist is about 2 and that relative to silicon nitride is about 5 to 6, when etching, for example, an Al alloy (Al–1% Si–0.5% Cu) by a chlorine-based etching gas containing molecules such as BCl$_3$ and Cl$_2$.

Figure 4:
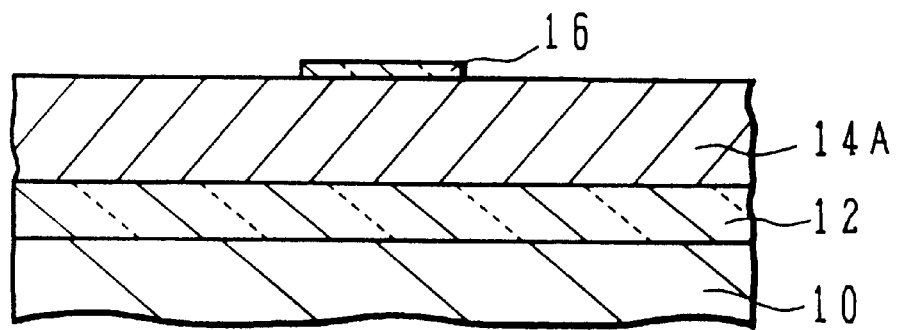
FIG. 4 is a cross-section of the substrate for explaining a resist removal process following the process of FIG. 3.
Figure 5:
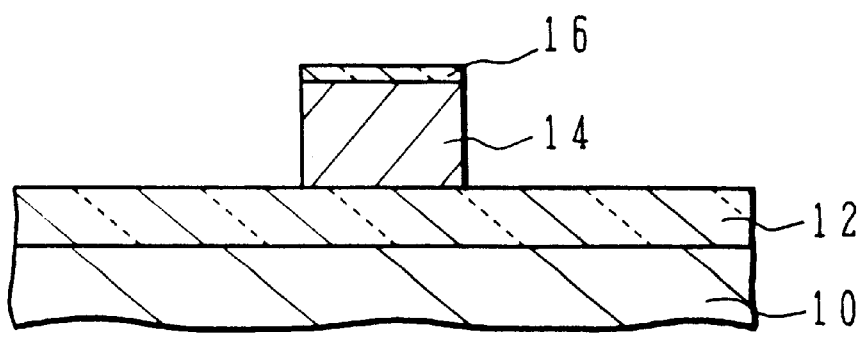
FIG. 5 is a cross-section of the substrate for explaining a wiring layer patterning process following the process of FIG. 4.

The improvement of the etching rate relative to the underlying film (SiO$_2$) will be discussed when only the silicon nitride film 16 is used as the etching mask as described with FIGS. 4 and 5.

For the dry etching of an Si based material (Si, silicide) by using a Cl-based or Br-based gas, the etching rate relative to SiO$_2$ can be improved by reducing the supply of carbon by replacing the resist mask by an inorganic mask.

For example, for the selective dry etching of a polysilicon layer formed on an SiO$_2$ film, the polysilicon etching speed Rp nm/min, SiO$_2$ etching speed Rs nm/min, and etching rate ratio R=Rp/Rs relative to polysilicon are shown in Table 1 with the comparison between a case of using a resist layer as an etching mask and a case of using a plasma CVD silicon nitride film as an etching mask.

TABLE 1

|    | Resist Layer Mask | Silicon Nitride Layer Mask |
|----|-------------------|----------------------------|
| Rp | 225.0             | 305.2                      |
| Rs | 26.0              | 13.9                       |
| R  | 8.7               | 22.0                       |

As seen from Table 1, it can be understood that the etching rate relative to SiO$_2$ can be improved by using the silicon nitride as the etching mask in place of the resist layer. The etching speed for the silicon nitride was 21.1 nm/min, and the minimum silicon nitride film thickness necessary for etching the polysilicon layer having a thickness of 350 nm at the over-etch of 30% was 31.5 nm. In the following description, an over-etch technique is defined the following etching technique.

To etch a film, for example, a metal wiring layer spread over a thick insulating film and a semiconductor substrate, etching is sustained even after the metal wiring layer deposited on the thick insulating film is exhausted. This is because the thickness of the metal wiring depends on the portion of its position. The metal wiring on a horizontal plane on the thick insulating film and the semiconductor substrate are substantially the same. On the contrary, the thickness of the metal wiring layer on a slope of the thick insulating film is generally thicker than that on the horizontal plane of the thick insulating film. Due to the difference of the films, the metal wiring layer on the slope of the thick insulating film still remains even after the metal wiring layer on the horizontal plane of the thick insulating film is exhausted. To exhaust the metal wiring layer on the slope of the thick insulating film, the etching process needs to be sustained. Such sustained etching is defined as the over-etch technique. The over-etch ratio is defined as a ratio of an excessive etching time after the metal wiring layer on the horizontal plane of the thick insulating film is exhausted to a time from the start of etching process until the metal wiring on the horizontal plane of the thick insulating film is exhausted.

The data in Table 1 was obtained by using a microwave plasma etcher. As the etching conditions, the flow rate of the etching gas was set to 50 sccm, the pressure was set to 5 mTorr, the RF power was set to 30 W at 2 MHz, and the microwave current (anode current of a magnetron) was set to 200 mA.

Figure 9C:
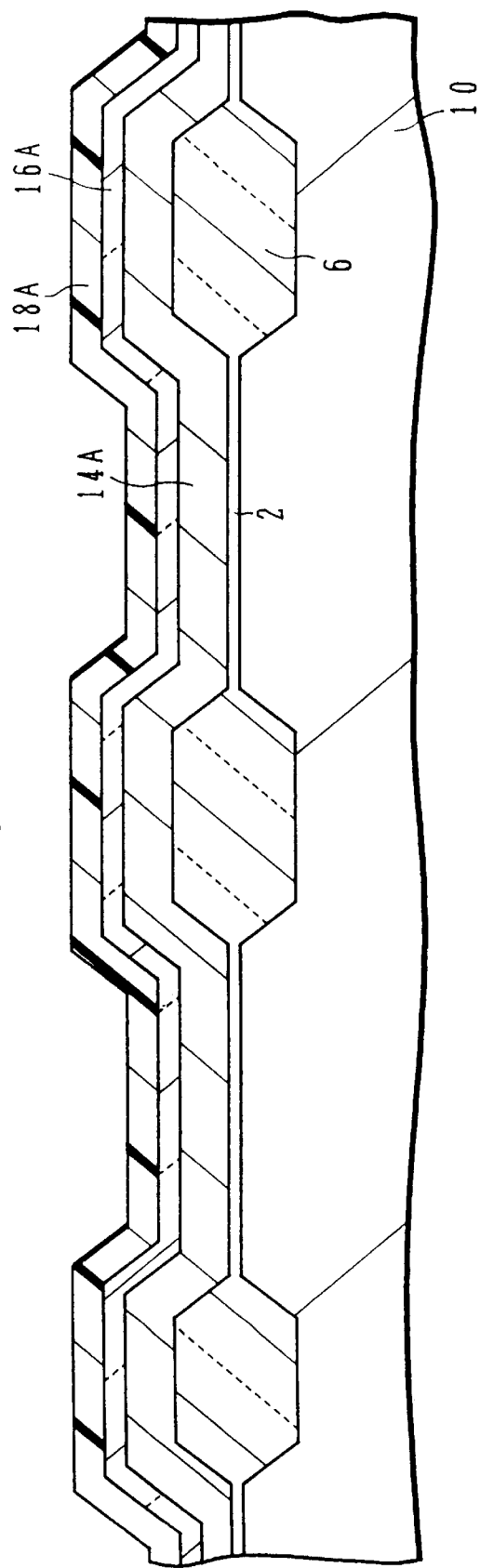
FIGS. 9A to 9T are cross sections of a substrate for explaining a semiconductor device manufacturing method according to another embodiment of the invention.
Figure 9E:
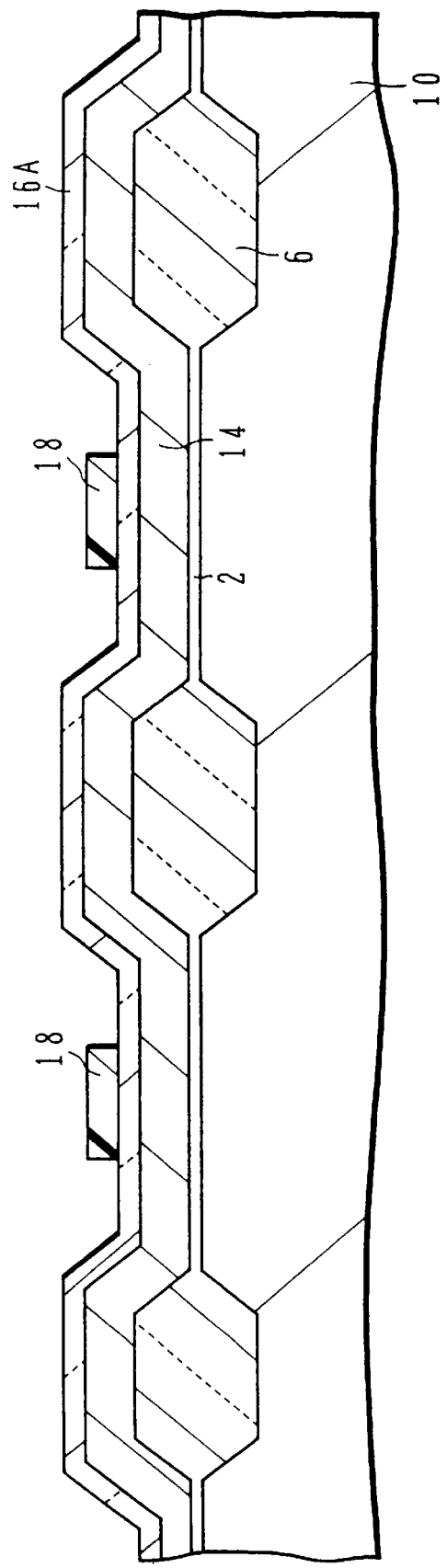
Figure 9F:
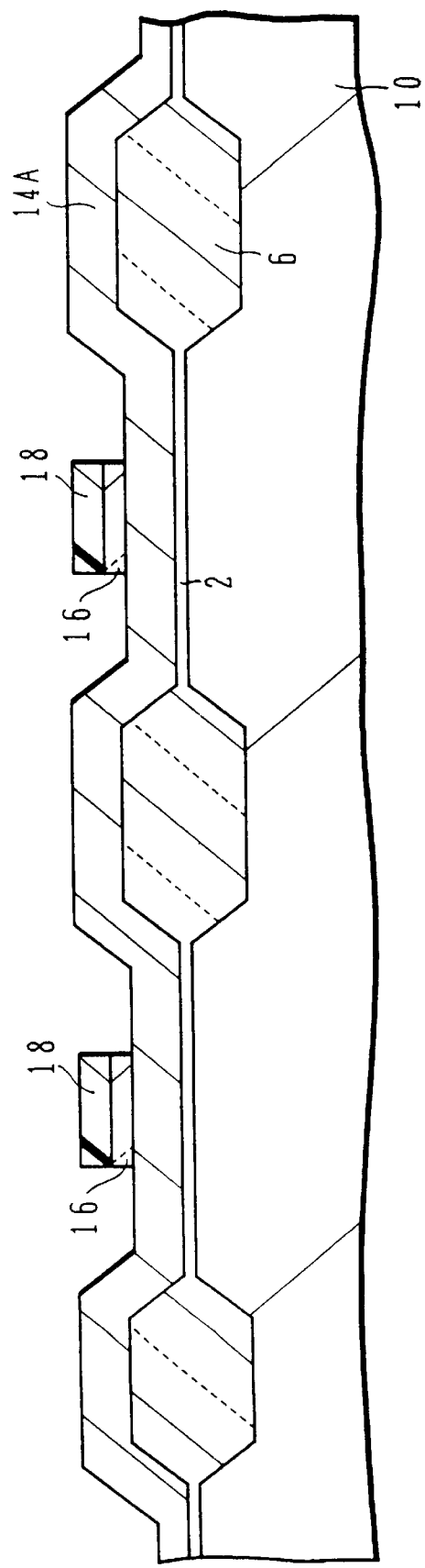
Figure 9G:
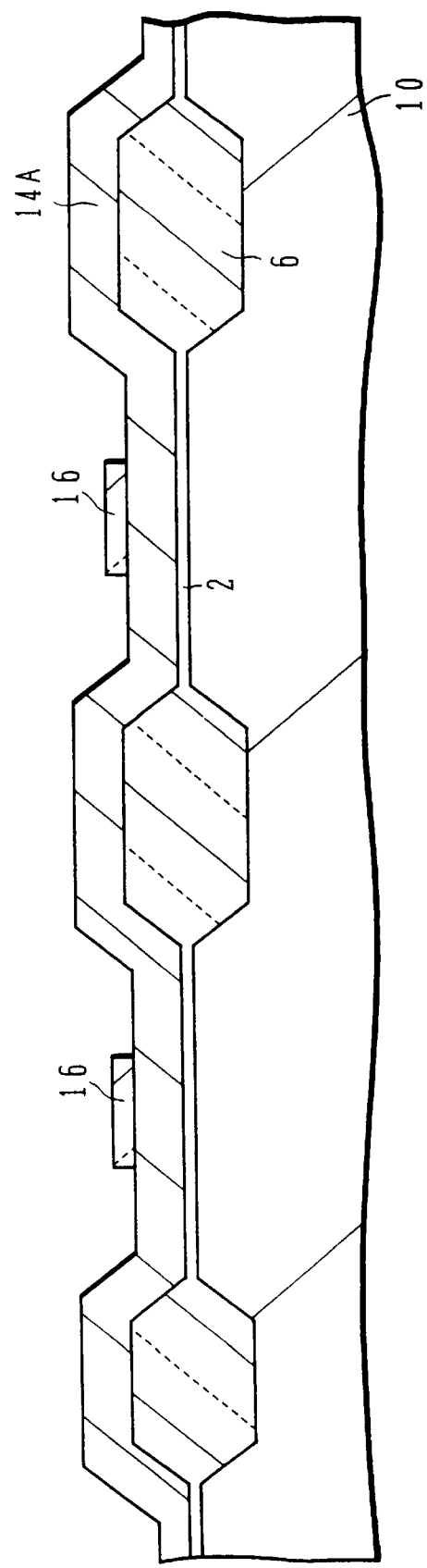
Figure 9H:
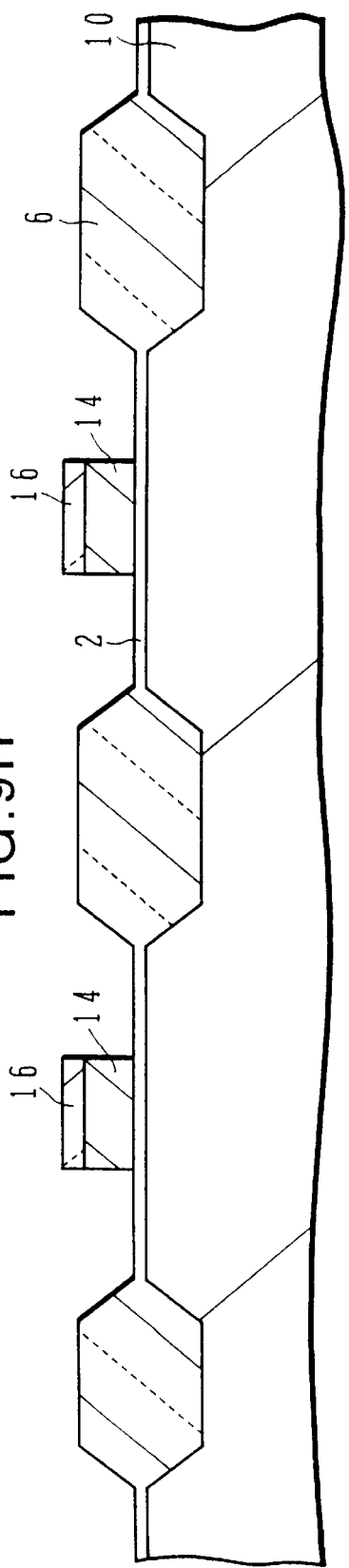
Figure 9I:
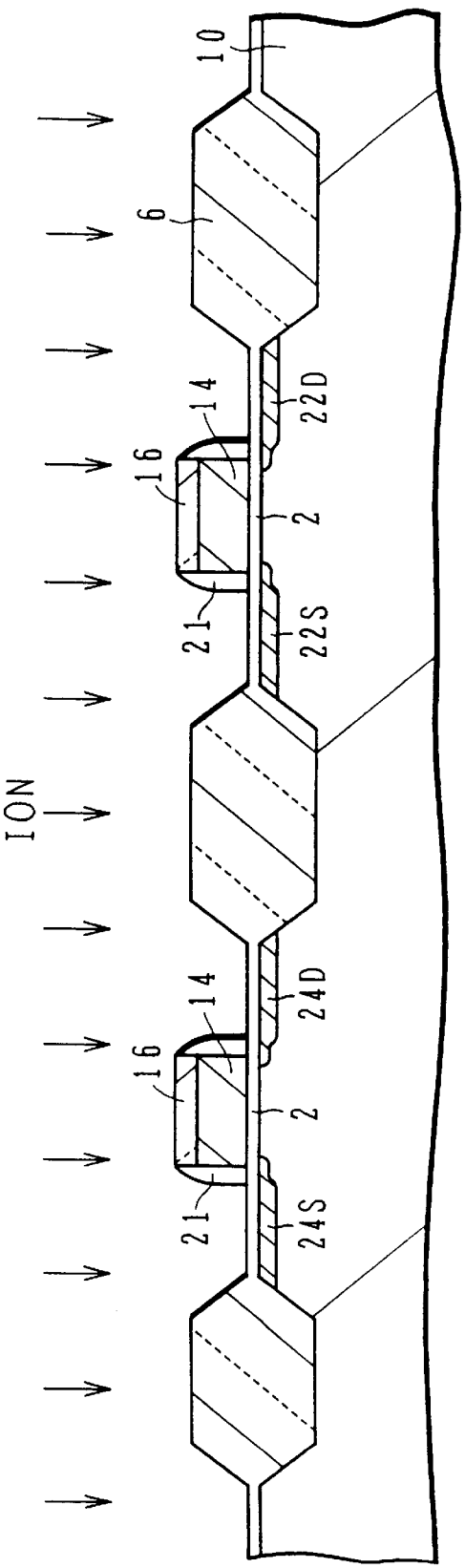
Figure 9J:
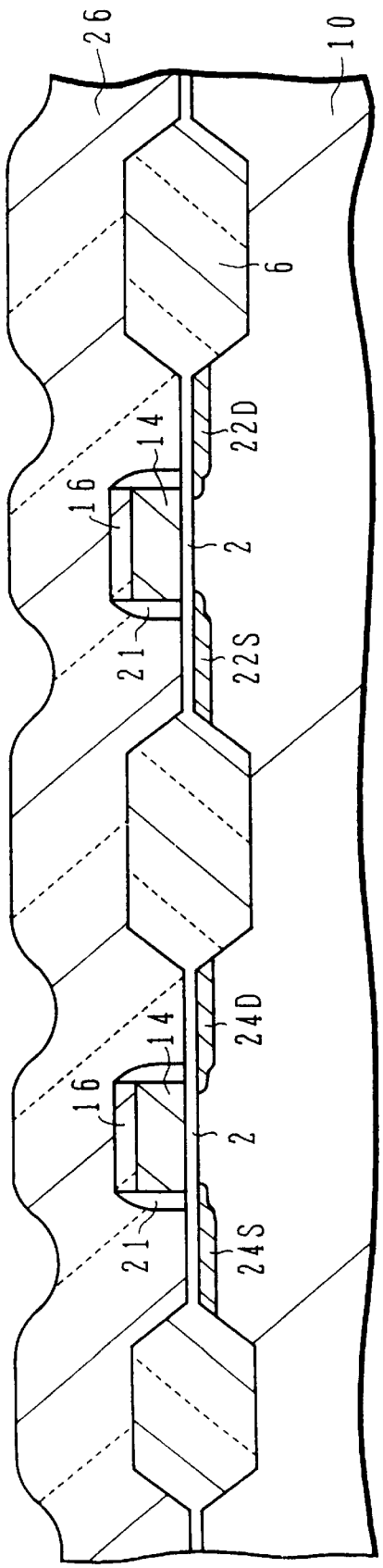
Figure 9K:
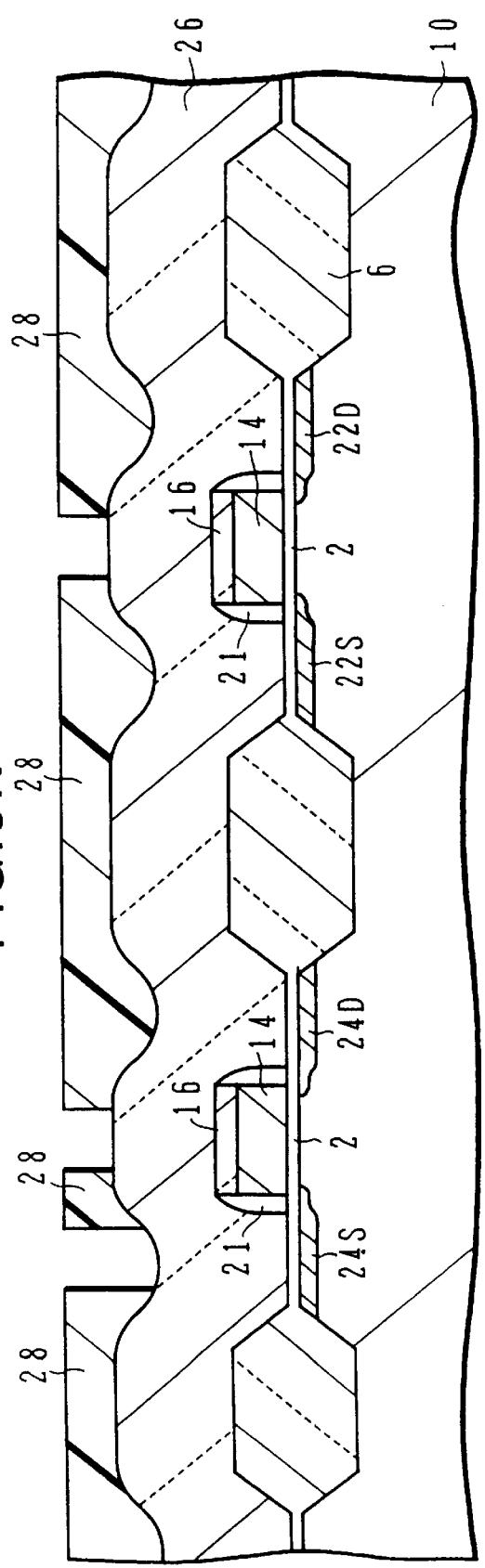
Figure 9L:
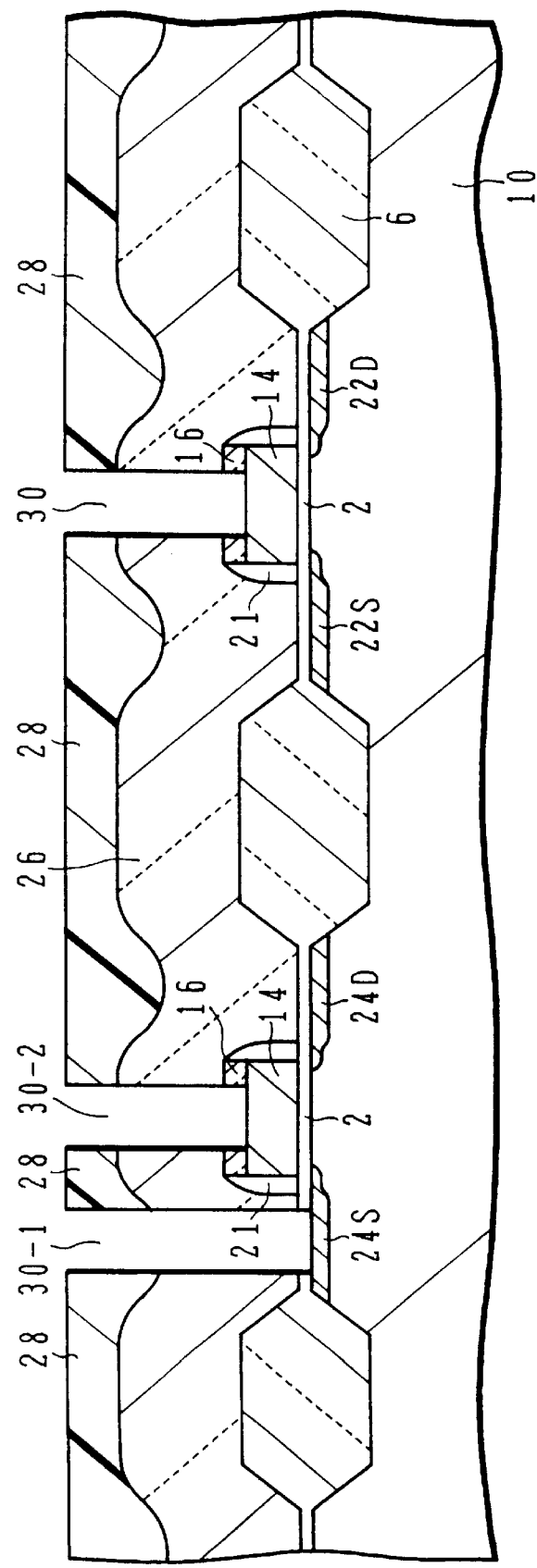
Figure 9M:
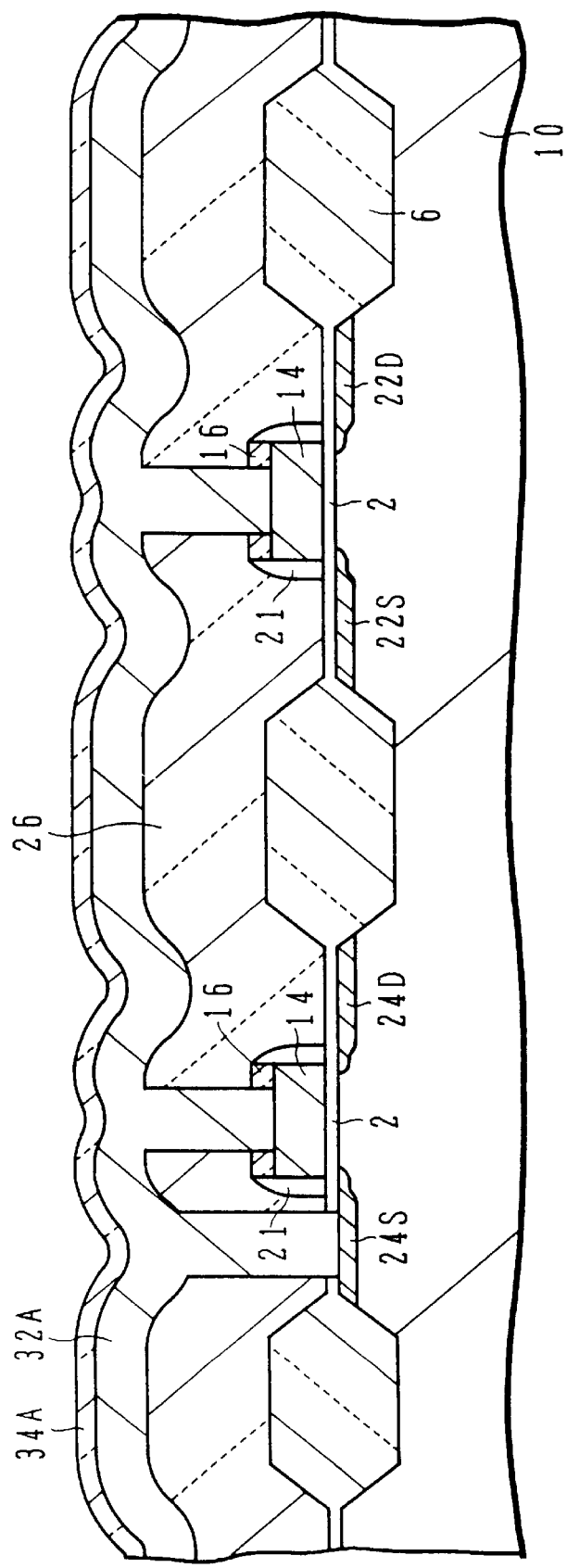
Figure 9O:
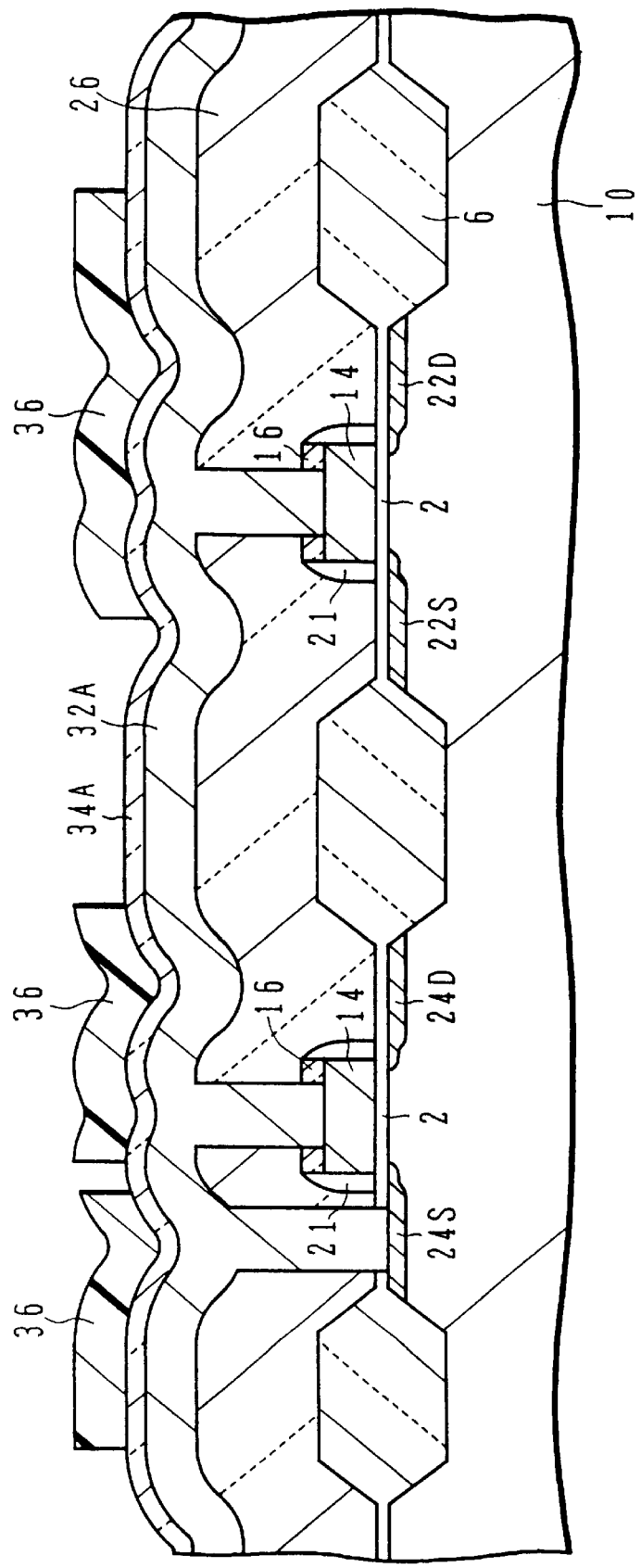
Figure 9P:
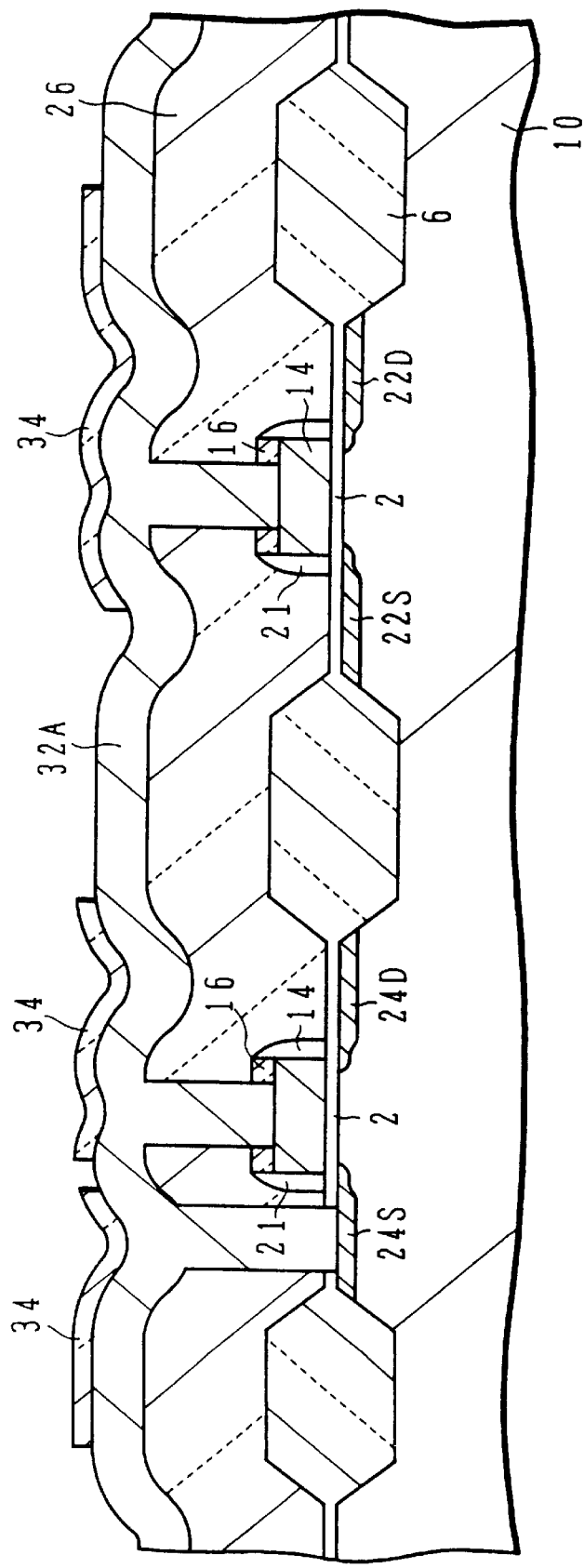
Figure 9Q:
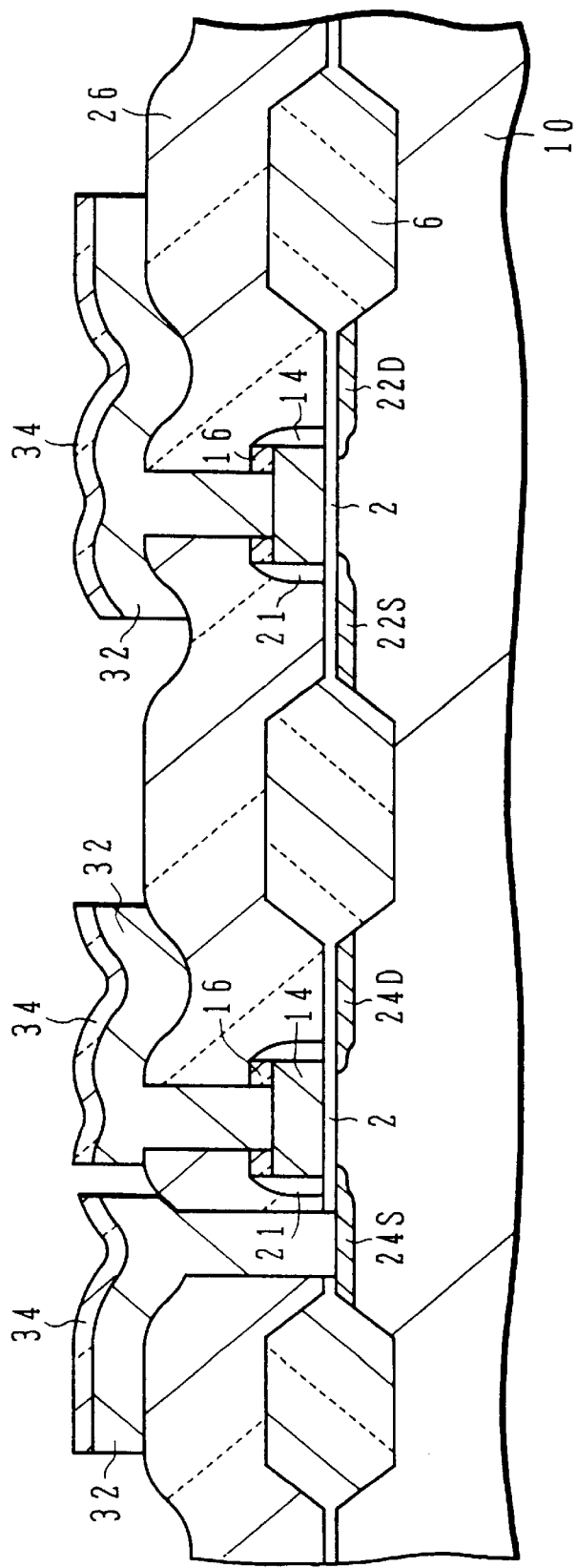
Figure 9R:
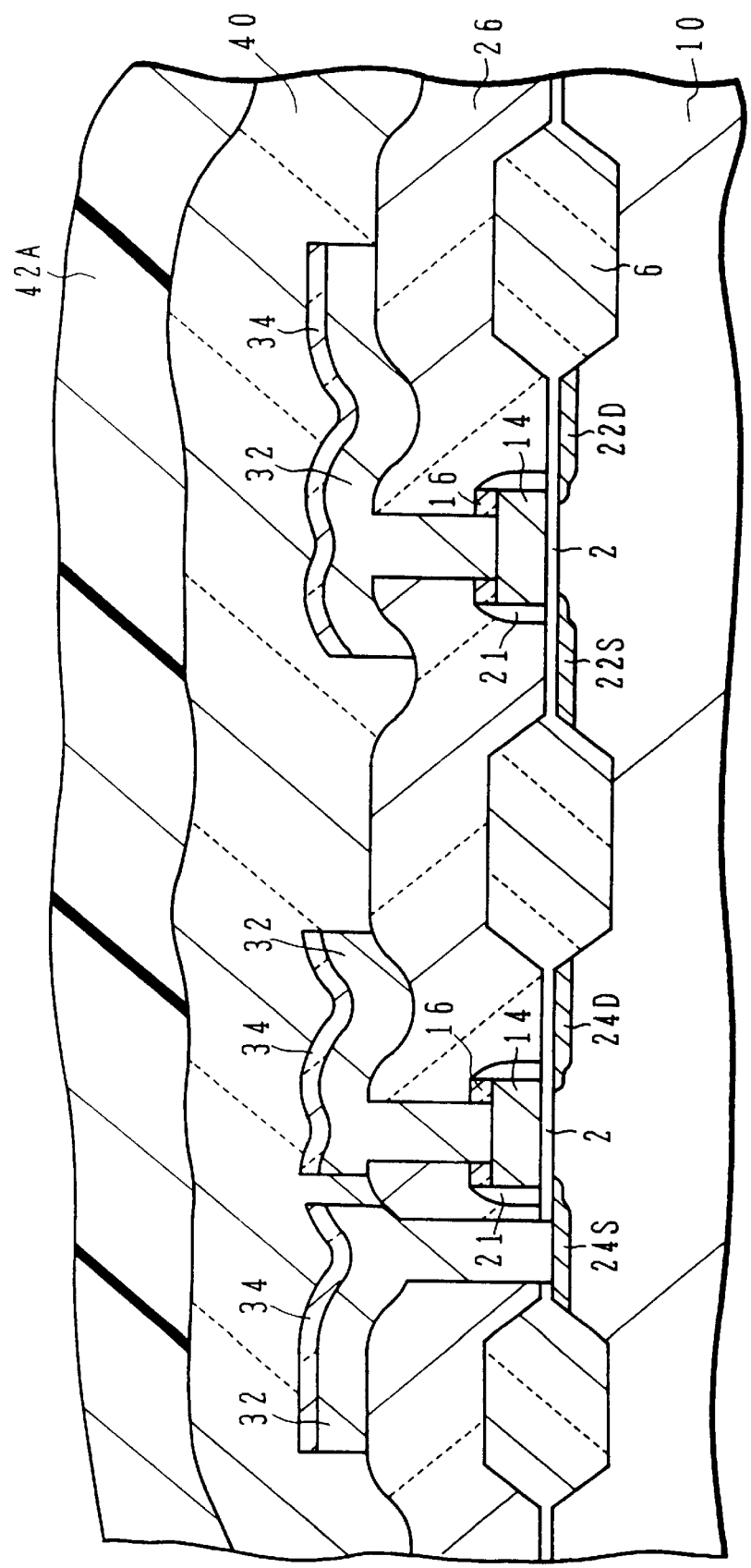
Figure 9S:
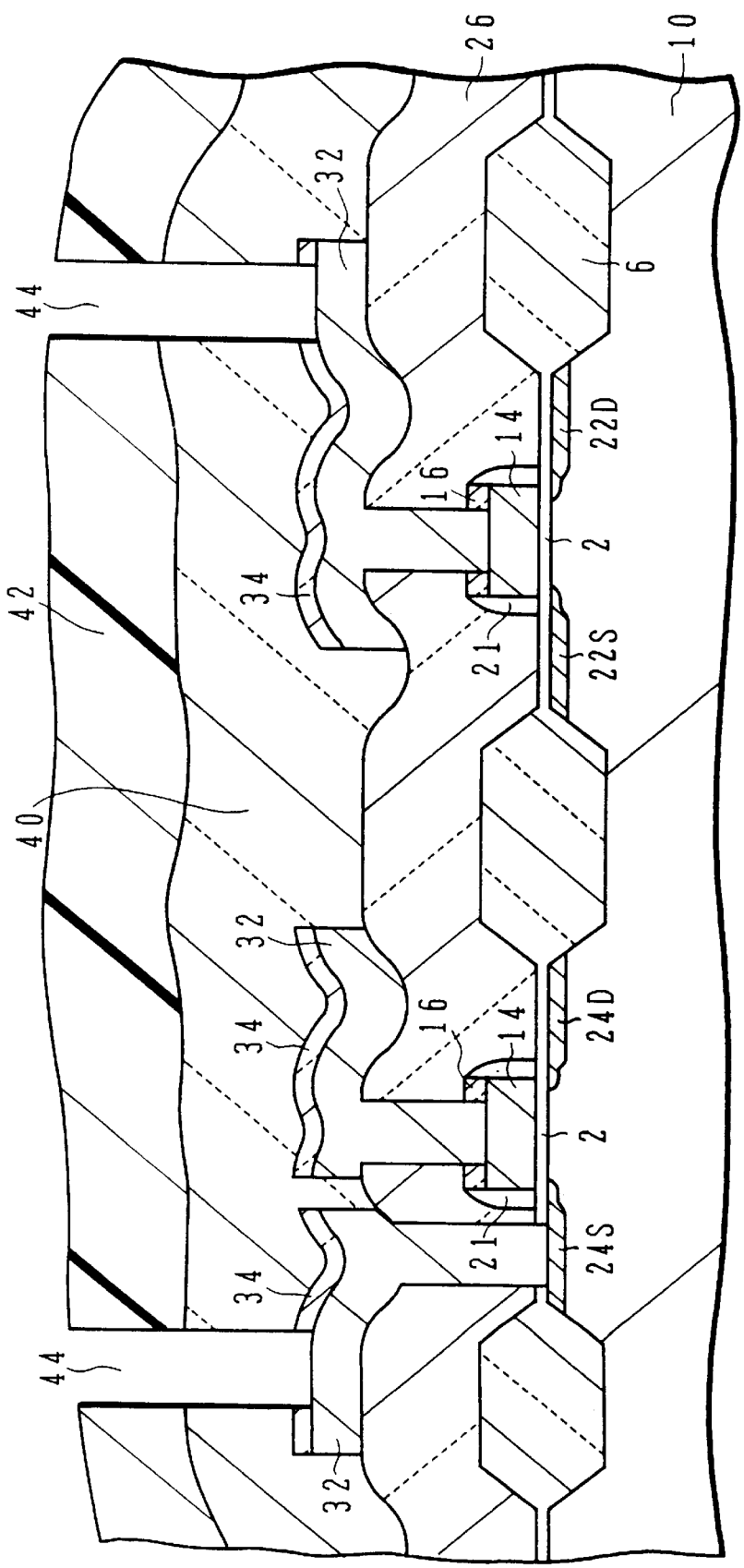
Figure 9T:
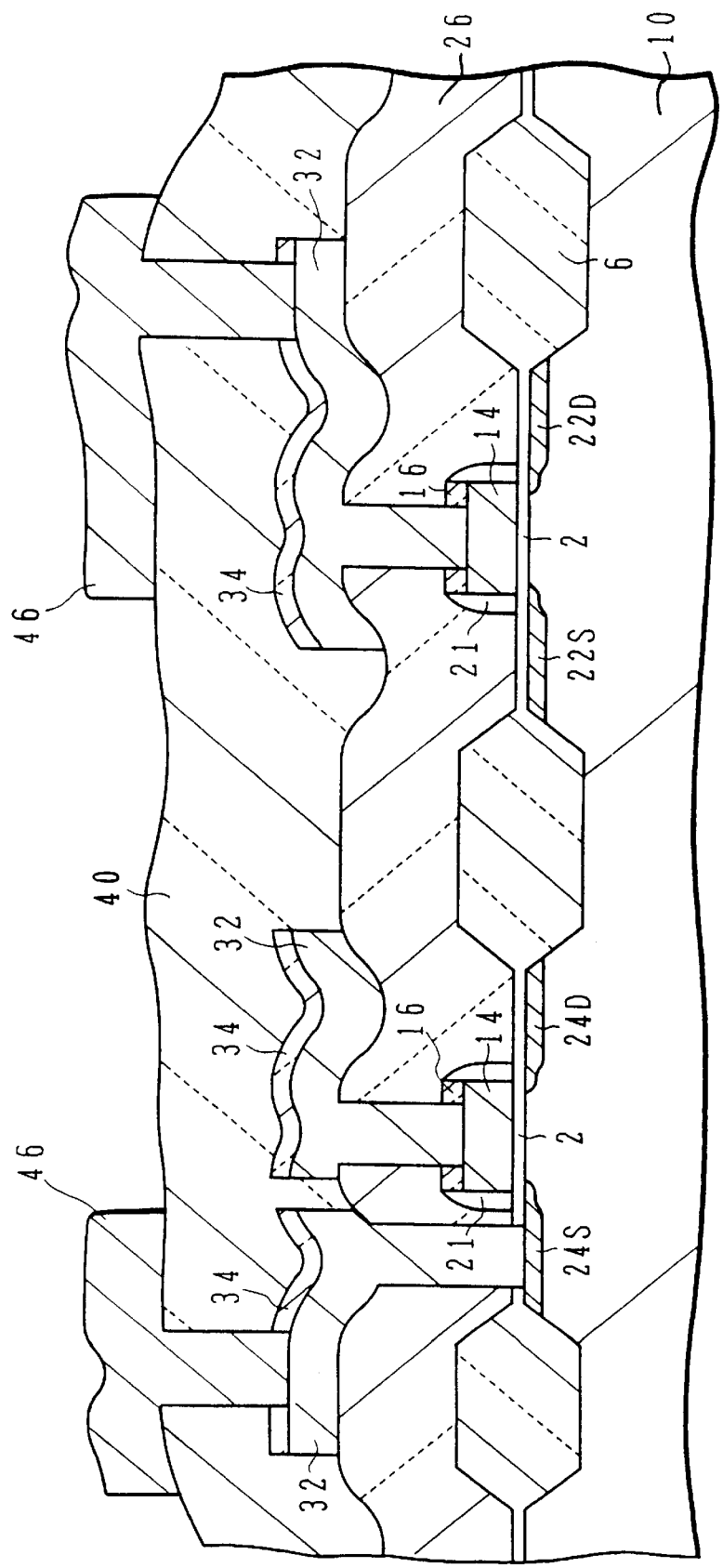

FIGS. 9A to 9T are cross-sections showing the main processes of a method of manufacturing a semiconductor device according to another embodiment of the present invention.

As shown in FIG. 9A, thin oxide films 2 and local thick oxide films 6 are formed on the surface of a silicon substrate 10 by thermal oxidation. Each of the regions of the local thick oxide films has a horizontal plane at the top thereof and a slope adjacent to the horizontal plane.

As shown in FIG. 9B, a conductive layer 14A such as polycrystalline silicon is deposited on the silicon substrate 10. As an alternative, a laminated structure of an upper silicide (e.g., WSi$_2$) layer and a lower polycrystalline silicon layer may be employed. The conductive layer 14A has an undulation due to the slope of the thick oxide film regions. An antireflection film 16A made of silicon nitride is deposited on the conductive layer 14A. The thickness of the antireflection film 16A is preferably determined in accordance with the material of the underlying conductive layer 14A. The antireflection film 16A reduces light scattering from the conductive layer 14A and has a lower etching rate than the etching rate of the conductive film 14A as described above.

As shown in FIG. 9C, a photoresist layer 18A is coated on the antireflection film 16A. The resist layer 18A is exposed as illustrated in FIG. 9D. Specifically, a light blocking or shielding mask (or reticle) 20 is disposed above the silicon substrate 10, and ultraviolet rays are irradiated from the position above the mask 20. Areas 18 where the ultraviolet rays are intercepted by the mask 20 are not exposed, but the other areas are exposed to the ultraviolet rays. Reflection of ultraviolet rays that have entered in the resist layer 18A is suppressed and eliminated by the antireflection film 16A. Therefore, even if there are undulated regions, the exposure and development can be performed with high precision.

As shown in FIG. 9E, by developing the resist layer 18A, the exposed resist areas are removed and the resist pattern 18 at the unexposed regions is left unremoved.

As shown in FIG. 9F, using the resist pattern 18 as an etching mask, the antireflection film 16A made of silicon nitride is selectively etched to obtain a nitride film pattern 16 which is used in later processes as an etching mask with $CF_4$ gas, a mixture of $CF_4+O_2$, $CF_4+CH_3+He$, and the like. After patterning the antireflection film 16A, the resist pattern 18 on the nitride film pattern 16 is removed, as shown in FIG. 9G.

As shown in FIG. 9H, by using the nitride film pattern 16 as an etching mask, the conductive layer 14A is etched to form a conductive layer pattern 14. The nitride film pattern 16 is left on the conductive pattern 14.

As shown in FIG. 9I, impurity-doped areas are formed in the silicon substrate 10 by implanting impurity ions. Source regions 22S and 24S and drain regions 22D and 24D of transistors are thereby formed. If the silicon substrate 10 is of a p-type, n-type impurities such as P and As are implanted. Ions are first implanted lightly. Then, side wall spacers 21 are made on the side walls of the gate electrodes 14 by CVD of tetraethyloxysilane (TEOS) and anisotropic reactive ion etching. Thereafter, impurity ions and implanted heavily. Thus, a lightly doped drain (LDD) structure can be made. Here, ions are not implanted into the semiconductor region under the thick oxide films 6 and the conductive layer pattern 14.

As shown in FIG. 9J, an interlayer insulating film 26 such as phospho-silicate glass (PSG) is deposited on the surface of the silicon substrate by CVD or the like. The surface of the interlayer insulating film 26 is undulated reflecting the underlie structure.

As shown in FIG. 9K, a resist layer is spin-coated and a resist pattern 28 is formed through exposure and development. The surface of the resist pattern is flat. The positions of holes formed in the resist pattern correspond to the positions of predetermined gate electrodes and source regions.

Next, as shown in FIG. 9L, using the resist pattern. 28 as an etching mask, the interlayer insulating film 28 is etched to form deep contact hole 30-1 and shallow contact holes 30-2 for the gate and source electrodes. The deep contact hole is formed down to the source region 24S on the semiconductor substrate 10, and the shallow contact holes 30-2 are formed down to the gate electrodes 14. In other words, the deep contact hole 30-1 pierces from a surface of the resist pattern 28 to the source region 24S, and the shallow contact holes 30-2 pierce from the surface of the resist pattern 28 to a surface of the gate electrodes 14. In this case, the nitride film mask 16 on the gate electrode works as a kind of etching stopper and retards the etching of the gate electrode 14. The nitride film 16 on the gate electrode 14 is finally etched out. As a result, the etching of the deep contact hole 30-1 and the shallow contact holes 30-2 is substantially coincidentally complete. The thickness of the silicon nitride film 16 is explained below. After the etching, the resist pattern 28 is removed.

As shown in FIG. 9M, a second conductive layer or metal layer 32A is deposited on the interlayer insulating film 26, and an antireflection layer 34A made of silicon nitride is deposited on the second metal layer 32A. The holes in the interlayer insulating film 26 are filled with the metal layer 32A. For the second conductive layer, a laminated structure of a lower layer of a barrier metal of Ti, TiN and the like, and an upper layer of aluminum or aluminum alloys may be employed, for example.

As shown in FIG. 9N, a resist layer 36A is coated on the antireflection film 34A. A mask (or reticle) 38 is disposed above the silicon substrate 10 with the resist layer 36A, and ultraviolet rays are selectively applied to expose the resist layer 36A. Reflection at the surface of the second metal layer 32A is suppressed or eliminated by the antireflection layer 34A.

As shown in FIG. 9O, through the exposure and development, a resist pattern 36 is formed. By using the resist pattern as an etching mask, the underlying antireflection film 34A is etched. After the etching, the resist mask 36 is removed to form an antireflection film pattern 34 as shown in FIG. 9P. This antireflection film pattern is used in later processes as an etching mask.

As shown in FIG. 9Q, by using the antireflection film pattern 34 as an etching mask, the second metal layer 32A is etched to form a metal layer pattern 32.

As shown in FIG. 9R, a second interlayer insulating film 40 is deposited on the patterned second metal layer 32 and the overlying antireflection film pattern 34, and thereafter, a resist layer 42A is spin-coated.

The resist layer 42A is exposed and developed to form a resist pattern 42 having window holes 44 as shown in FIG. 9S. By using the resist pattern 42 as an etching mask, the second interlayer film 40 and antireflection film pattern 34 are selectively etched through the window holes by a gas including fluorine species to expose a part of the metal layer pattern 32 and to form a contact hole to the second metal layer pattern 32. In this case, the antireflection film pattern 34 works as a kind of etching stopper and retards the etching of the second metal layer pattern 32 and prevents the pattern 32 from being excessively etched.

The silicon nitride layer 34 is etched with $CF_4$ or $CF_4+O_2$. In the case the second metal layer pattern 32 including aluminum or aluminum alloys is excessively exposed to an etching gas including fluorine, aluminum is not etched but aluminum fluoride ($AlF_3$) is generated. As $AlF_3$ has a low evaporation pressure, $AlF_3$ is hard to pump out. Then, $AlF_3$ resides on a surface of the metal wiring 32 or on inner walls of window holes 44 formed through the resist layer 42. In another phenomenon, aluminum or aluminum alloys are sputtered from the second metal wirings 32 by the etching gas, then finally re-deposited on the inner walls of the window holes 44 formed in the resist layer 42. Such residuals are hard to remove by an ashing process and the subsequent acid cleaning process for the resist layer. In the present embodiment, the antireflection film pattern 34 on the second metal layer 32 retards the etching of the second metal layer 32, as described above, and consequently the, the second metal layer 32 is protected from being exposed to the etching gas. Therefore, the antireflection film pattern 34 prevents the second metal layer 32 from being etched and suppresses the generation of such etching residuals in the resist layer 42A. In another aspect of the invention, etching of interlayer pattern 40 with high power is possible until the antireflection film pattern 34 is exhausted, as the antireflection film pattern 34 covers the surface of the metal layer pattern 32, thereby suppressing the generation of etching residuals. Therefore, the time period needed for etching can be shortened. After the etching, the window holes 44 selectively expose the surface of the second metal layer pattern 32.

As shown in FIG. 9T, a metal connection layer 46 is deposited to fill the window holes 44, and patterned to form a connection wiring 46.

The examples of process details of manufacturing the semiconductor device of the embodiment shown in FIGS. 9A to 9T will now be described.

The material of the gate electrode 14A is polysilicon or polysilicon/silicide lamination (polycide), and is deposited to 150 to 450 nm by sputtering. Although not shown, the material may also be deposited to 400 to 600 nm at regions other than at the gate electrodes. The antireflection films 16A and 34A made of silicon nitride are deposited to 40 to 60 nm by plasma CVD. The oxide film 26 made of boron phosphosilicate glass (BPSG) or PSG is deposited to 500 to 900 nm by CVD. The first wiring layer 32A made of aluminum is deposited to 600 to 1000 nm by sputtering. Ti or TiW may be optionally deposited as an underlying. The material of the second wiring layer 46 is also aluminum. The interlayer insulating film 40 made of BPSG is deposited to 400 to 1000 nm by CVD.

Aluminum is etched under the following conditions by using a microwave plasma etcher available from Hitachi, Ltd., Japan.

As the etching gas, $BCl_3$ and $Cl_2$ are used at flow rates of 60 and 90 sccm, respectively, under the pressure of 8 mTorr, at an RF power of 60 to 90 W, at an anode current (microwave power) of 300 mA, and at an electrode temperature of 35 to 40° C., Other etching gasses may also be used including:
$BCl_3+Cl_2+N_2$,
$BCl_3+Cl_2+CHF_3$,
$BCl_3+Cl_2+CF_4$,
$BCl_3+Cl_2+CH_2$,
$BCl_3+Cl_2+CHClF_2$, and
$SiCl_4+BCl_3+Cl_2(+CHF_3)$.

The etching of the interlayer oxide film for forming a via hole or contact hole is performed under the following conditions.

As the etching gas, the mixture of $CF_4$, $CHF_3$, and He is used at respective flow rates of 16, 24, and 88 sccm, at the total pressure of 260 Pa, and at an RF power of 400 W. The etching speed is set to 569.5 nm/min for BPSG, to 222.9 nm/min for the silicon nitride film formed b y plasma CVD with an etching ratio of 2.55 relative to BPSG, and to 182.3 nm for the silicon nitride film formed by reactive sputtering with an etching ratio of 3.12 relative to BPSG.

Other etching gasses may also be used including:
$CH_4+CHF_3+Ar$,
$CHF_3+O_2(+He)$,
$C_4F_8+O_2$,
$C_2F_6+CHF_3$,
$CHF_3+CH_2F_2$, and
$C_4F_8$.

With the gas system of $C_4F_8+O_2$, the etching ratio of a silicon oxide film to a silicon nitride film can be made large to about 20. Therefore, this gas system is effective for etching the silicon oxide film having a thickness greater than that of a silicon nitride film.

The polycide electrode is etched by using an ECR (Electron Cyclotron Resonance) plasma etcher available from Sumitomo Metal Industries, Ltd., Japan. The other conditions include an etching gas of $Cl_2+O_2$ at flow rates of 25 and 11 sccm, respectively, a pressure of 2 mTorr, an RF power of 40 W at 13.56 MHz, a microwave power of 1400 W at 2.45 GHz, and an electrode temperature of 15 to 20° C.

As the etching gas for polysilicon, the following gasses may be used:
$Cl_2$, $Cl_2+O_2$, HBr, $HBr+O_2$, $HBr+Cl_2$, $HBr+Cl_2+O_2$, HI, $Cl_2+N_2$, and $Cl_2+O_2+N_2$.

As the etching gas for tungsten silicide, the following gasses may by used:
$Cl_2+O_2$, $Cl_2+N_2$, and $Cl_2+O_2+N_2$.

The above-described wiring forming method is applicable to the selective dry etching of wiring layers made of materials, such as (1) polysilicon, (2) $WSi_2$ deposited on polysilicon (polycide), (3) $WSi_2$, (4) a lamination of $WSi_2$, Al alloy, and $WSi_2$ in this order from the bottom ($WSi_2$/Al alloy/$WSi_2$), (5) Al alloy, and (6) W.

As the etching mask, it is preferable to use a silicon nitride film for the materials (1) and (2), a laminated structure of resist and silicon nitride for the materials (4) and (5), and a silicon nitride for the materials (3) and (6) if the conductive layer is used as a gate electrode.

Although the present invention has been described in connection with the above embodiments shown in the drawings, the invention is not intended to be limited only to the embodiments. It is apparent for those skilled in the art that various other modifications, substitutions, improvements, combinations, and the like are possible within the scope and spirit of the invention.

What is claimed is:

1. A method for manufacturing a semiconductor device having a metal electrode on a semiconductor body and a second metal wiring over the metal electrode, the method comprising the steps of:

(a) forming a device element including the metal electrode on a surface of the semiconductor body;

(b) forming a first interlayer insulating film overlying the device element;

(c) forming a second metal wiring over the first interlayer insulating film, the second metal wiring having a metal layer and an antireflection film formed of silicon nitride overlying the metal layer;

(d) forming a second interlayer insulating film over the second metal wiring;

(e) forming a resist layer having a window hole, over the second interlayer insulating film; and (f) etching the second interlayer insulating film and the antireflection film through the window hole by a gas including fluorine species to form a contact hole to the metal layer in the second metal wiring, the antireflection film limiting exposure of the metal layer to the etching gas to substantially prevent the metal layer from being etched to thereby suppress generation of etching residual in the resist layer which would otherwise be produced by reaction of the etching gas with the conductive layer.

2. The method of claim 1, wherein the forming step (c) provides an aluminum containing layer as the metal layer.

3. The method of claim 2, wherein the etching residuals include aluminum fluoride.

4. The method of claim 1, wherein the forming step (b) provides 500 to 900 nm of one of boron phosphosilicate glass (BPSG) and phosphosilicate glass (PSG) as the first interlayer insulating film.

5. The method of claim 1, wherein the forming step (d) provides 400 to 1000 nm of boron phosphosilicate glass (BPSG) as the second interlayer insulating film.

6. A method for manufacturing a semiconductor device on a semiconductor substrate, the method comprising:

forming a device element and a metal wiring connected to the device element on the substrate, the metal wiring having an antireflection layer formed of silicon nitride thereon;

depositing an insulating layer over the metal wiring; and etching the insulating layer by an etching gas including fluorine as a constituent element to form a contact hole through the insulating film and the antireflection layer of the metal wiring, the antireflection layer suppressing generation of etching residuals including fluorine and metal from the metal wiring, which would be generated if the metal were subjected to etching.

7. The method of claim 6, including:

forming a second metal wiring layer over the insulating layer to form a connection with the metal wiring layer.

8. The method of claim 6, wherein the metal wiring includes aluminum.

9. The method according to claim 8, wherein the etching residuals include aluminum fluoride.

10. A method for manufacturing a semiconductor device on a semiconductor substrate, the method comprising:

providing the semiconductor substrate having a first portion with a device element, the device element having an antireflection layer formed of silicon nitride thereon, the semiconductor substrate having a second portion without the antireflection layer thereabove;

forming an insulating layer over the device element and the second portion of the substrate, the insulating layer having a higher etching rate than an etching rate of the antireflection layer;

etching to form a first contact hole through the antireflection layer and through the insulating layer to the device element and a second contact hole through the insulating layer to the second portion of the semiconductor substrate which second contact hole is deeper than the first contact hole, the antireflection layer on the device element retarding etching of the first contact hole so as to complete forming the first and second holes substantially simultaneously.

11. The method of claim 10, wherein the device element is a gate electrode.

12. The method of claim 10, wherein the antireflection layer has a thickness of 50 to 60 nm.

13. A method for manufacturing a semiconductor device, the method comprising:

forming a conductive film over a surface of a semiconductor substrate;

forming an antireflection film formed of silicon nitride overlying the conductive film;

patterning the antireflection film and the conductive film, after the step of forming the antireflection film;

forming an interlayer insulating layer overlying the antireflection film; and selectively etching the interlayer insulating layer to form a hole reaching through the antireflection film only on a top surface of the conductive film, the antireflection film also serving as an etch stopper to substantially prevent etching of the conductive film.

* * * * *